United States Patent
Korbler et al.

(10) Patent No.: US 9,049,520 B2
(45) Date of Patent: Jun. 2, 2015

(54) COMPOSITE TRANSDUCER APPARATUS AND SYSTEM FOR PROCESSING A SUBSTRATE AND METHOD OF CONSTRUCTING THE SAME

(71) Applicant: Akrion Systems LLC, Allentown, PA (US)

(72) Inventors: John A. Korbler, Mertztown, PA (US); Richard Novak, Plymouth, MN (US)

(73) Assignee: AKRION SYSTEMS LLC

( * ) Notice: Subject to any disclaimer, the term of this patent is extended or adjusted under 35 U.S.C. 154(b) by 0 days.

(21) Appl. No.: 14/281,829

(22) Filed: May 19, 2014

(65) Prior Publication Data

US 2014/0254325 A1 Sep. 11, 2014

Related U.S. Application Data

(60) Continuation-in-part of application No. 13/633,662, filed on Oct. 2, 2012, now abandoned, which is a continuation of application No. 12/266,543, filed on Nov. 6, 2008, now Pat. No. 8,279,712, application No.

(Continued)

(51) Int. Cl.
  *B08B 3/12* (2006.01)
  *B08B 7/00* (2006.01)
  *B08B 7/04* (2006.01)
  (Continued)

(52) U.S. Cl.
  CPC *H04R 17/00* (2013.01); *B08B 3/12* (2013.01); *B06B 1/0629* (2013.01); *H01L 41/37* (2013.01); *H01L 41/183* (2013.01); *B06B 2201/71* (2013.01); *B06B 1/0633* (2013.01)

(58) Field of Classification Search
  CPC .. B06B 1/0607; B06B 1/0633; B06B 1/0629; B06B 1/0614; B06B 1/0655; B06B 2201/20; B06B 2201/55; H01L 41/37; H04R 17/00; H04R 17/005; B08B 3/12
  USPC ............... 134/184, 902, 1, 1.3; 367/155, 157
  See application file for complete search history.

(56) References Cited

U.S. PATENT DOCUMENTS

| 3,260,991 A | 7/1966 | Laakmann et al. |
| 4,672,591 A | 6/1987 | Breimesser et al. |

(Continued)

FOREIGN PATENT DOCUMENTS

| CN | 1289212 | 3/2001 |
| WO | 8100078 | 1/1981 |
| WO | 2009061970 | 5/2009 |

*Primary Examiner* — Alexander Markoff
(74) *Attorney, Agent, or Firm* — The Belles Group, P.C.

(57) ABSTRACT

An apparatus and method for processing articles utilizing acoustic energy. In one embodiment, the invention is an apparatus comprising a support; a conduit for applying a fluid to a surface of the article; and a transducer assembly comprising: a transmitting structure having a concave inner surface and a convex outer surface; a first acoustic transducer having a convex bottom surface bonded to the concave inner surface of the transmitting structure, wherein the first acoustic transducer is configured to create a first acoustically active area on the convex outer surface of the transmitting structure when the first acoustic transducer is energized; and a second acoustic transducer having a convex bottom surface bonded to the concave inner surface of the transmitting structure, wherein the second acoustic transducer is configured to create a second acoustically active area on the convex outer surface of the transmitting structure when the second acoustic transducer is energized.

6 Claims, 27 Drawing Sheets

Related U.S. Application Data

14/281,829, which is a continuation-in-part of application No. 13/686,697, filed on Nov. 27, 2012, which is a division of application No. 12/871,286, filed on Aug. 30, 2010, now Pat. No. 8,316,869, which is a continuation of application No. 11/625,556, filed on Jan. 22, 2007, now Pat. No. 7,784,478.

(60) Provisional application No. 60/985,947, filed on Nov. 6, 2007, provisional application No. 61/034,142, filed on Mar. 5, 2008, provisional application No. 60/760,820, filed on Jan. 20, 2006, provisional application No. 60/837,965, filed on Aug. 16, 2006, provisional application No. 60/850,930, filed on Oct. 11, 2006.

(51) Int. Cl.
   *H04R 17/00* (2006.01)
   *B06B 1/06* (2006.01)
   *H01L 41/37* (2013.01)
   *H01L 41/18* (2006.01)

(56) References Cited

U.S. PATENT DOCUMENTS

| | | |
|---|---|---|
| 5,037,481 A | 8/1991 | Bran |
| 5,090,432 A | 2/1992 | Bran |
| 5,286,657 A | 2/1994 | Bran |
| 5,317,618 A | 5/1994 | Nakahara et al. |
| 5,556,479 A | 9/1996 | Bran |
| 5,629,578 A | 5/1997 | Winzer et al. |
| 5,648,942 A | 7/1997 | Kunkel, III |
| 5,792,058 A | 8/1998 | Lee et al. |
| 6,039,059 A | 3/2000 | Bran |
| 6,122,837 A | 9/2000 | Olesen |
| 6,140,744 A | 10/2000 | Bran |
| 6,295,999 B1 | 10/2001 | Bran |
| 6,378,534 B1 | 4/2002 | Olesen et al. |
| 6,463,938 B2 | 10/2002 | Bran |
| 6,539,952 B2 | 4/2003 | Itzkowitz |
| 6,539,962 B2 | 4/2003 | Paper et al. |
| 6,679,272 B2 | 1/2004 | Bran et al. |
| 6,681,782 B2 | 1/2004 | Bran |
| 6,684,891 B2 | 2/2004 | Bran |
| 6,699,111 B2 | 3/2004 | Legner et al. |
| 6,732,749 B2 | 5/2004 | Myland |
| 6,754,980 B2 | 6/2004 | Lauerhaas et al. |
| 6,755,352 B1 | 6/2004 | Toda |
| 6,758,094 B2 | 7/2004 | Miller |
| 6,799,583 B2 | 10/2004 | Puri et al. |
| 6,843,855 B2 | 1/2005 | Verhaverbeke |
| 6,859,984 B2 | 3/2005 | Dinet et al. |
| 6,866,051 B1 | 3/2005 | Nickhou et al. |
| 6,904,921 B2 | 6/2005 | Beck et al. |
| 6,946,774 B2 | 9/2005 | Beck et al. |
| 6,951,042 B1 | 10/2005 | Mikhaylichenko et al. |
| 6,955,727 B2 | 10/2005 | Korbler et al. |
| 7,100,304 B2 | 9/2006 | Lauerhaas et al. |
| 7,145,286 B2 | 12/2006 | Beck et al. |
| 7,784,478 B2 * | 8/2010 | Fani et al. ............... 134/174 |
| 8,279,712 B2 * | 10/2012 | Korbler et al. ............... 367/155 |
| 8,316,869 B2 * | 11/2012 | Fani et al. ............... 134/153 |
| 2002/0029788 A1 | 3/2002 | Verhaverbeke et al. |
| 2002/0185152 A1 | 12/2002 | Lauerhaas et al. |
| 2003/0192571 A1 | 10/2003 | Yeo et al. |
| 2004/0069319 A1 | 4/2004 | Boyd et al. |
| 2004/0113524 A1 | 6/2004 | Baumgartner et al. |
| 2004/0132318 A1 | 7/2004 | Kim et al. |
| 2004/0168706 A1 | 9/2004 | Boyd et al. |
| 2005/0003737 A1 | 1/2005 | Montierth et al. |
| 2005/0145267 A1 | 7/2005 | Korolik et al. |
| 2005/0199277 A1 | 9/2005 | Scranton |
| 2005/0221038 A1 | 10/2005 | Park |
| 2005/0252522 A1 | 11/2005 | Struven et al. |
| 2006/0235300 A1 | 10/2006 | Weng et al. |
| 2006/0278253 A1 | 12/2006 | Verhaverbeke |
| 2007/0169800 A1 | 7/2007 | Fani et al. |
| 2007/0170812 A1 * | 7/2007 | Fani et al. ............... 310/311 |
| 2009/0231959 A1 | 9/2009 | Korbler et al. |
| 2013/0333723 A1 * | 12/2013 | Fani et al. ............... 134/1.3 |
| 2014/0216508 A1 * | 8/2014 | Korbler ............... 134/184 |

\* cited by examiner

COMPOSITE TRANSDUCER APPARATUS AND SYSTEM FOR PROCESSING A SUBSTRATE AND METHOD OF CONSTRUCTING THE SAME

CROSS-REFERENCE TO RELATED PATENT APPLICATIONS

The present patent application is a continuation-in-part of U.S. patent application Ser. No. 13/633,662, which is a continuation of U.S. patent application Ser. No. 12/266,543, filed Nov. 6, 2008, now issued as U.S. Pat. No. 8,279,712, which in turn claims the benefit of U.S. Provisional Patent Application Ser. No. 60/985,947, filed Nov. 6, 2007 and U.S. Provisional Patent Application Ser. No. 61/034,142, filed Mar. 5, 2008, the entireties of which are hereby incorporated by reference.

The present patent application is also a continuation-in-part of U.S. patent application Ser. No. 13/686,697, which is a divisional of U.S. patent application Ser. No. 12/871,286, filed Aug. 30, 2010, now issued as U.S. Pat. No. 8,316,869, which in turn is a continuation of U.S. patent application Ser. No. 11/625,556, filed Jan. 22, 2007, now issued as U.S. Pat. No. 7,784,478, which in turn claims the benefit of U.S. Provisional Patent Application Ser. No. 60/760,820, filed Jan. 20, 2006; U.S. Provisional Patent Application Ser. No. 60/837,965, filed Aug. 16, 2006; and U.S. Provisional Patent Application Ser. No. 60/850,930, filed Oct. 11, 2006, the entireties of which are hereby incorporated by reference.

FIELD OF THE INVENTION

The present invention relates generally to the field of processing flat articles utilizing acoustic energy, and specifically to systems, methods and apparatus that utilize acoustic energy for cleaning flat articles, such as semiconductor wafers.

BACKGROUND OF THE INVENTION

In the field of semiconductor manufacturing, it has been recognized since the beginning of the industry that removing particles from semiconductor wafers during the manufacturing process is a critical requirement to producing quality profitable wafers. While many different systems and methods have been developed over the years to remove particles from semiconductor wafers, many of these systems and methods are undesirable because they cause damage to the wafers. Thus, the removal of particles from wafers must be balanced against the amount of damage caused to the wafers by the cleaning method and/or system. It is therefore desirable for a cleaning method or system to be able to break particles free from the delicate semiconductor wafer without resulting in damage to the device structure.

Existing techniques for freeing the particles from the surface of a semiconductor wafer utilize a combination of chemical and mechanical processes. One typical cleaning chemistry used in the art is standard clean 1 ("SC1"), which is a mixture of ammonium hydroxide, hydrogen peroxide, and water. SC1 oxidizes and etches the surface of the wafer. This etching process, known as undercutting, reduces the physical contact area to which the particle binds to the surface, thus facilitating removal. However, a mechanical process is still required to actually remove the particle from the wafer surface.

For larger particles and for larger devices, scrubbers have been used to physically brush the particle off the surface of the wafer. However, as device sizes shrank in size, scrubbers and other forms of physical cleaners became inadequate because their physical contact with the wafers cause catastrophic damage to smaller devices.

The application of acoustic/sonic energy during wet processing has gained widespread acceptance to effectuate particle removal, especially to clean sub-micron particles off wafers (or plates) undergoing fabrication in the semiconductor process line. The acoustic energy used in substrate processing is generated via a source of acoustic energy. Typically, this source of sonic energy comprises a transducer which is made of piezoelectric material, such as a ceramic or crystal. In operation, the transducer is coupled to a source of electrical energy. An electrical energy signal (i.e. electricity) is supplied to the transducer. The transducer converts this electrical energy signal into vibrational mechanical energy (i.e. acoustic energy) which is then transmitted to the substrates being processed. The transmission of the acoustic energy from the transducer to the substrates is typically accomplished by a fluid that acoustically couples the transducer to the substrate. It is also typical that a material capable of acoustic energy transmission be positioned between the transducer itself and the fluid coupling layer to avoid "shorting" of the electrical contacts on the piezoelectric material. This transmitting material can take on a wide variety of structural arrangements, including a thin layer, a rigid plate, a rod-like probe, a lens, etc. The transmitting material is usually produced of a material that is inert with respect to the fluid coupling layer to avoid contamination of the substrate.

The application of acoustic energy to substrates has proven to be a very effective way to remove particles and to improve the efficiency of other process steps, but as with any mechanical process, damage to the substrates and devices thereon is still possible. Further, there are increasingly stringent cleanliness and PRE requirements, which make the removal of particles from both sides/surfaces of the wafer increasingly important in achieving high yields. Thus, there remains a need for a system that can achieve improved PRE with minimized device damage.

SUMMARY OF THE INVENTION

The present invention is directed to a system and method for cleaning substrates. In one embodiment, an apparatus comprises: a support for supporting an article to be processed; a conduit for applying a fluid to a surface of the article; and a transducer assembly comprising: a transmitting structure having a concave inner surface and a convex outer surface; a first acoustic transducer having a convex bottom surface bonded to the concave inner surface of the transmitting structure, wherein the first acoustic transducer is configured to create a first acoustically active area on the convex outer surface of the transmitting structure when the first acoustic transducer is energized; and a second acoustic transducer having a convex bottom surface bonded to the concave inner surface of the transmitting structure, wherein the second acoustic transducer is configured to create a second acoustically active area on the convex outer surface of the transmitting structure when the second acoustic transducer is energized, wherein: the second acoustic transducer is spaced from the first acoustic transducer so that an acoustically inactive area exists on the convex outer surface between the first and second acoustically active areas when the first and second acoustic transducers are energized, the transducer assembly is positioned adjacent to and opposing the surface of the article so that when the fluid is applied to the surface of the article by the conduit, the convex outer surface of the transmitting structure is fluidly coupled to the surface of the article, and the transducer assembly is oriented so that the acoustically inactive area of the convex outer surface faces the surface of the article and is closer to the surface of the article than the first and second acoustically active areas of the transmitting structure.

DETAILED DESCRIPTION OF THE DRAWINGS

Figure 1:
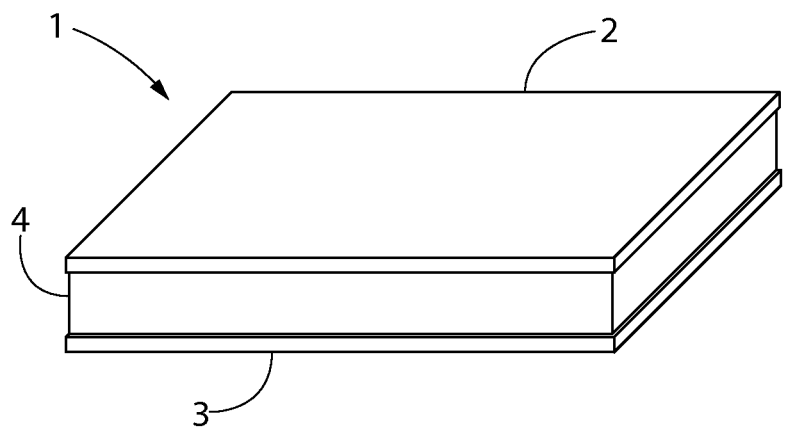
FIG. 1 is a schematic of a prior art transducer.

The following description of the preferred embodiment(s) is merely exemplary in nature and is in no way intended to limit the invention, its application, or uses.

The description of illustrative embodiments according to principles of the present invention is intended to be read in connection with the accompanying drawings, which are to be considered part of the entire written description. In the description of the exemplary embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top," "bottom," "front" and "rear" as well as derivatives thereof (e.g., "horizontally," "downwardly," "upwardly," etc.)

should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," "secured" and similar refer to a relationship wherein structures are secured or attached to one another either directly or indirectly through intervening structures, as well as both movable or rigid attachments or relationships, unless expressly described otherwise. Moreover, the features and benefits of the invention are described by reference to the exemplary embodiments illustrated herein. Accordingly, the invention expressly should not be limited to such exemplary embodiments, even if indicated as being preferred. The discussion herein describes and illustrates some possible non-limiting combinations of features that may exist alone or in other combinations of features. The scope of the invention is defined by the claims appended hereto.

The description is provided in two sections. Section I discusses a first group of embodiments, shown in FIGS. 3A-14, and Section II discusses a second group of embodiments, shown in FIGS. 15-28.

I.

Figure 2:
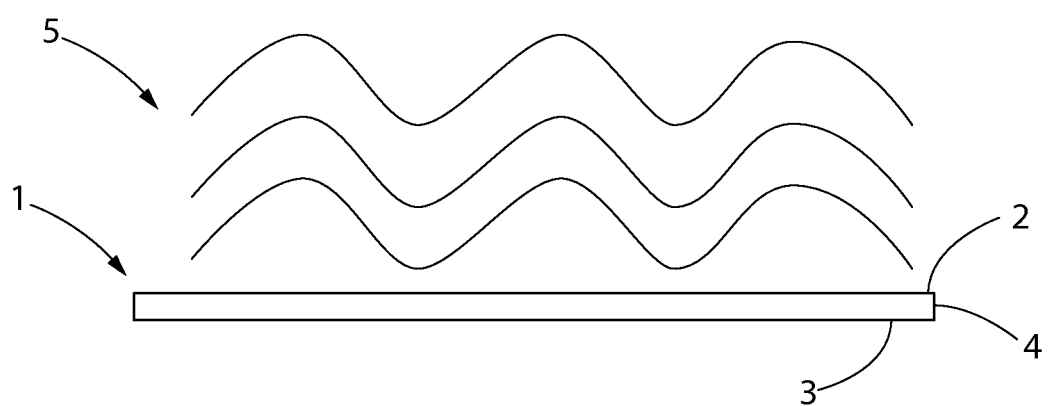
FIG. 2 is a schematic illustrating an acoustic wave generated by the prior art transducer of FIG. 1 having nodes and antinodes.

Referring to FIG. 1, a typical prior art transducer 1 used in existing acoustic processing systems is illustrated. While the exact shape and orientation of the prior art transducer 1 used in the industry varies, all known prior art transducers 1 are large flat plate structures. It has been discovered that these prior art transducers 1 have an issue in that when they are driven with electrodes 2, 3 on opposite sides the plate and the piezoelectric material 4 is set into oscillation by its inherent piezoelectric effect, the resulting oscillations tend to be multi-nodal depending on the exact shape of the flat plate structure. As can be seen in FIG. 2, this in effect launches a complicated acoustic wave 5. This acoustic wave 5 has a non uniform energy pattern.

In addition, if the transducer 1 is positioned so that its major surfaces are parallel to a substrate to be processed (i.e., the acoustic wave 5 propagates in a direction perpendicular to the surface of the substrate), the acoustic wave 5 reflects off the surface of the wafer and returns toward the transducer 1. This creates a standing wave. In fact, the standing wave problem has been discovered to exist even in transducer arrangements where the acoustic energy wave is transmitted parallel to the surface of the wafer but has a radial component that is normal to the wafer.

A standing wave consists of nodes and antinodes and therefore in terms of energy, subjects the wafer to localized areas of high and low energy points. The wave returning to the transducer 1 dissipates heat into the transducer 1 and consequently requires some form of cooling, either liquid and/or gas. Without cooling, some of the components associated with the construction can be quickly degraded. The impedance of a typical ceramic or crystal piezoelectric material also changes as a function of temperature. If the temperature changes from the temperature at which it was matched to the power supply (fixed match to 50 ohm load) the piezoelectric material dissipates additional energy in the material as heat. This further heats the transducer 1 causing still more changes in impedance. Left unchecked, this will lead to failure of the transducer 1.

Referring now to FIGS. 3A-3F, a composite transducer 100 and its construction at according to one embodiment of the present invention will be described. To begin, a typical flat stock piece of a piezoelectric material is provided (not shown). The piezoelectric material can be a ceramic, crystal or any other material capable of converting electrical energy to mechanical energy. The flat stock piece of piezoelectric material is then placed on a wax base 10 or other supporting material, such as an adhesive. In some embodiment, the supporting material may be an electrode (discussed later). The supporting material can be any material or structure capable of performing the supporting function described below.

Figure 3A:
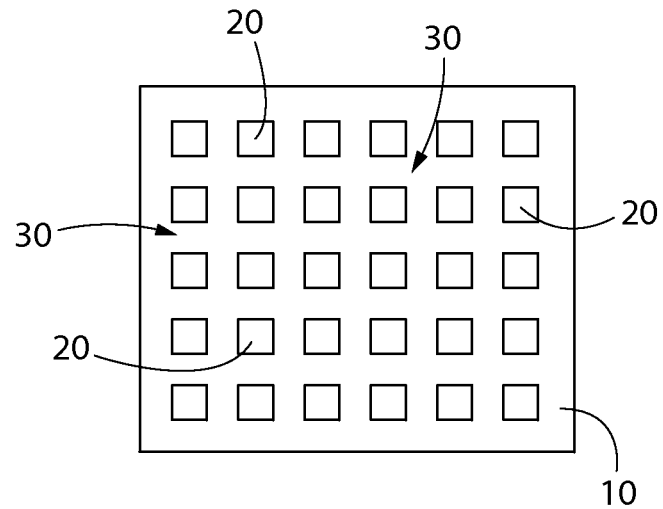
FIG. 3A is a top view of an array of piezoelectric pillars supported on a wax base and used to create a transducer according to one embodiment of the present invention.
Figure 3B:
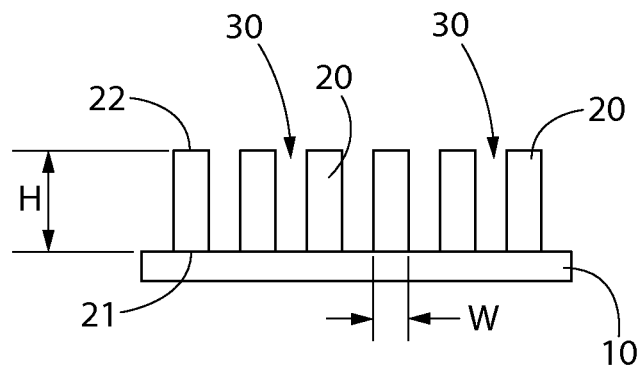
FIG. 3B is a side view of the array of piezoelectric pillars of FIG. 3A.
Figure 3C:
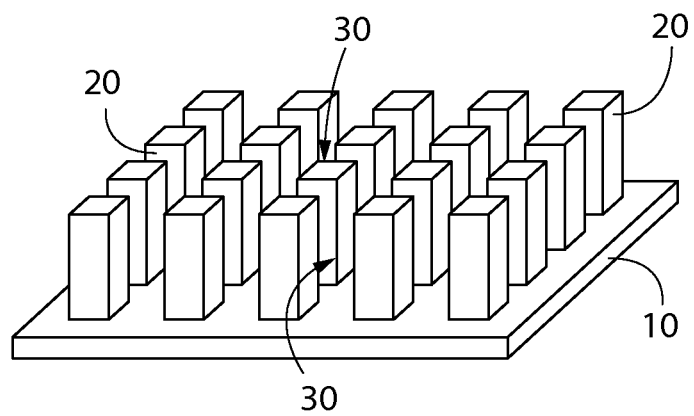
FIG. 3C is a perspective view of the array of piezoelectric pillars of FIG. 3A.

Referring now to FIGS. 3A-3C exclusively, once the flat stock piezoelectric material is placed on the wax base 10, the piezoelectric material is cut into pieces in both x and y planes, thereby forming an array of pillars 20 of the piezoelectric material. During the cutting process the saw preferably cuts only through the flat stock piezoelectric material, and not the wax base 10. The wax base 10 holds the pillars 20 in place in their spaced apart and generally upright orientation. A plurality of intersecting channels are formed between the pillars 20 thereby providing spaces 30 between adjacent pillars 20. While the pillars 20 are in an equally spaced-apart array configuration in the illustrated embodiment, other configurations and geometric patterns can be achieved. Moreover, if desired, the pillars 20 can take on other geometric shapes, including cylindrical, radial segment, etc. In order to avoid clutter, only a few of the pillars 20 and spaces 30 are numerically identified in the drawings.

Each of the pillars 20 has a height H defined by the distance between its bottom surface 21 and its top surface 22. Each of the pillars also has a width W. It is preferable that the height H of the pillars 20 be greater than the width W. It is even more preferred that the height H be twice the width W or greater. It is also preferred that pillar width W and the width of spaces 30 be approximately equal, or at the very least of the same magnitude. In other embodiments, it may be preferred that the width of the spaces 30 be smaller than the width W of the pillars 20.

Moreover, from a functionality standpoint, it is also preferred that the width W of the pillars 20 and the width of the spaces 30 be less than a wavelength of the acoustic energy waves to be generated by the composite transducer 100. For the example, for a pillar 20 operating at a 1 MHz frequency, the preferred dimensions are that the height H of the pillar 20 be approximately 1.6 mm, the width W of the pillar 20 be approximately 0.8 mm or less, and the width of the surrounding spaces 30 be less than or equal to 0.8 mm in the active areas. In other embodiments which are described later, it may be desirable to have not acoustically active areas. There are various means to create active and non-active acoustical generating areas described later.

Figure 3D:
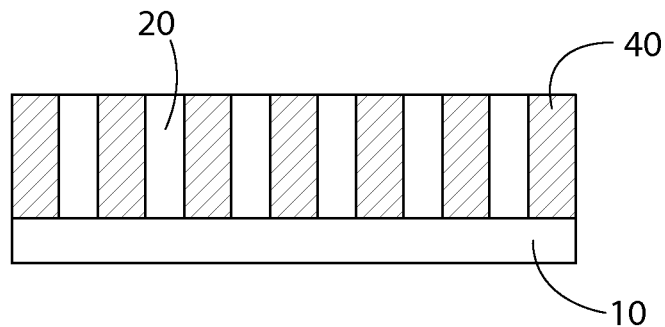
FIG. 3D is a side view of the array of piezoelectric pillars of FIG. 3A with the spaces between pillars filled with a resilient material, according to one embodiment of the present invention.

Referring now to FIG. 3D, once the pillars 20 are created, the spaces 30 are backfilled with a curable filler 40. In one embodiment, the curable filler is preferably a resilient material 40. Other examples of curable fillers include elastomers and epoxies. Once the filler 40 cures, the wax base 10 is removed, thereby resulting in a composite assembly 50 formed by the pillars 20 of piezoelectric elements separated by the filler 40. The composite assembly is shown in FIG. 3E.

Figure 3E:
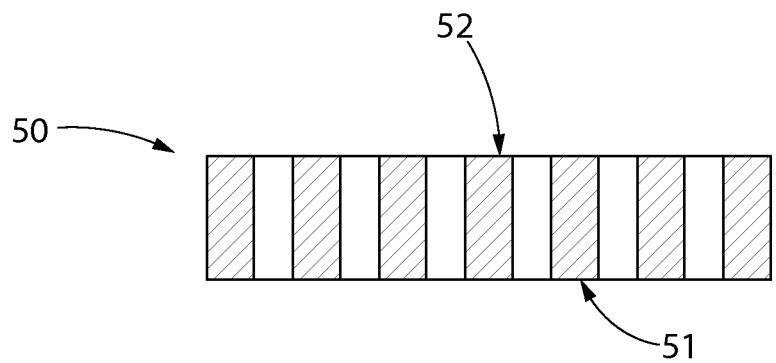
FIG. 3E is a side view of a composite assembly comprising the piezoelectric pillars with the spaces between pillars filled with a resilient material as shown in FIG. 3D, wherein the wax base has been removed, according to one embodiment of the present invention.

Referring now to FIG. 3E, the composite assembly 50 comprises a bottom surface 51 and a top surface 52. As will be described in detail below, the composite assembly 50 can be formed or later shaped so as have curvature.

Figure 3F:
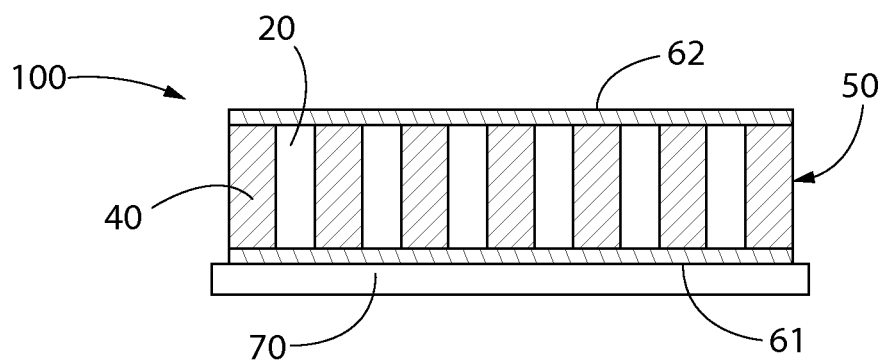
FIG. 3F is a side view of a transducer incorporating the composite assembly of FIG. 3E according to one embodiment of the present invention, wherein a transmitting material is bonded to the bottom electrode.

Referring now to FIG. 3F, once the composite assembly 50 is in the desired shape (which is flat in the illustrated embodiment), an electrically conductive material is applied to the bottom and top surfaces 51, 52 of the composite assembly 50, thereby forming electrodes 61, 62. As a result, a transducer 100 according to one embodiment of the present invention is formed. The electrically conductive material used to form the electrodes 61, 62 can be a metal, such as silver, an electrically conductive epoxy, or any material that can conduct an electric current to excite the piezoelectric pillars 20.

Figure 6:
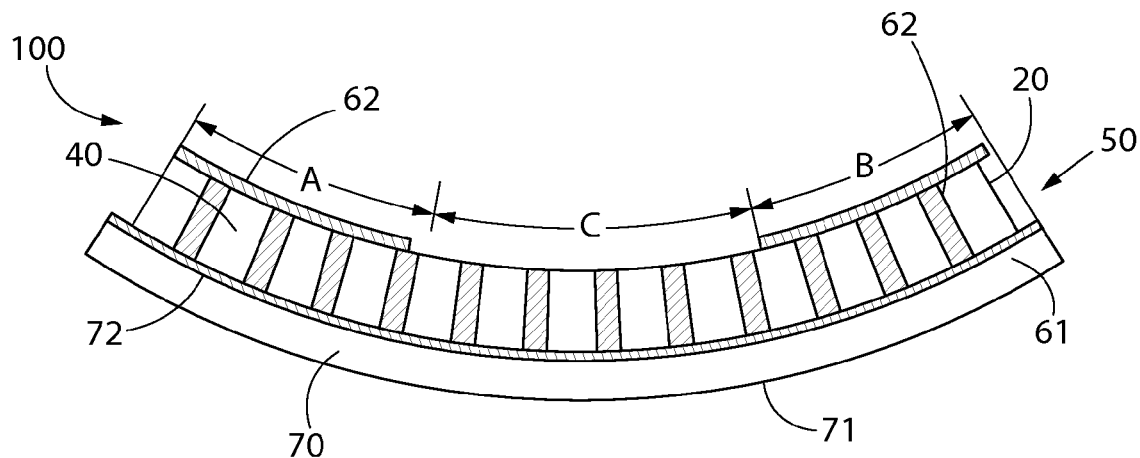
FIG. 6 is a cross-sectional side view of a curved composite transducer according to one embodiment of the present invention.

As will be described in greater detail below, in certain situations it may be desirable to only energize a certain one or subsets of the piezoelectric pillars 20. Thus, while the electrodes 61, 62 are shown as being applied to entirety of the bottom and top surfaces 51, 52 of the composite assembly 50, in other embodiments the electrodes 61, 62 may cover only selected areas that are electrically isolated from one another (as shown in the embodiment of FIG. 6).

When the transducer 100 is to be used in conjunction with the wet processing of articles, it may be desirable to shield the transducer 100 (and its electrodes) from the processing liquid so as to avoid shorting and/or contamination of the processing fluid. This can be achieved by bonding a transmitting structure 70 (generically illustrated) to the transducer 100. As illustrated in FIG. 3F, the transmitting structure 70 is bonded directly to the transducer 100. The transmitting structure 70 can be constructed of a wide variety of materials, shapes and dimensions. Depending on the intended function, the transmitting structure can be a rigid structure or a thin film or foil. Suitable materials for the transmitting structure 70 include polymers, quartz, sapphire, boron nitride vitreous carbide, stainless steel, or any other material that can effectively transmit acoustic energy to facilitate the intended processing.

In one embodiment, it may be preferred that the transmitting structure 70 be a polymer film. Suitable polymers include materials like Halar (ECTFE), Polyvinylidene Fluoride (PVDF), Polysulfone or other polymers. The thickness of the polymer film can preferably range from 0.1 mil to 18 mil, and more preferably range from 1 mil to 5 mil. These polymer films may be treated chemically or otherwise manufactured to improve the surface characteristics of the material to provide a low surface tension toward the processing fluid.

Figure 4A:
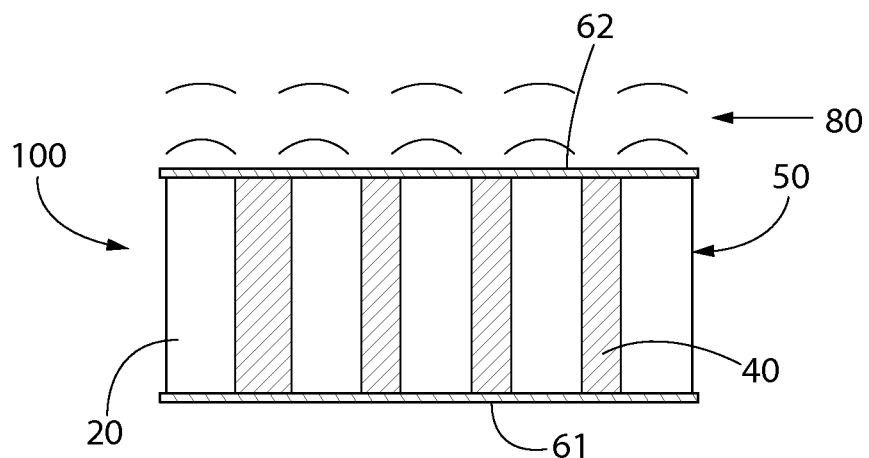
FIG. 4A is a schematic representation of the transducer of FIG. 3F wherein the electrodes are energized so that the individual pillars are generating acoustic energy waves, according to one embodiment of the present invention.

Referring now to FIG. 4A, a schematic representation of the transducer 100 energized so as to generate acoustic energy. Electricity is supplied to the electrodes 61, 62 by wires that are operably connected to a source of electricity. The electricity is converted by each of the piezoelectric pillars 20 into independent acoustic waves 80. As can be seen, the pillars 20 act as independent pistons, each generating its own independent acoustic wave 80 in a direction that is substantially parallel to its height H.

Figure 4B:
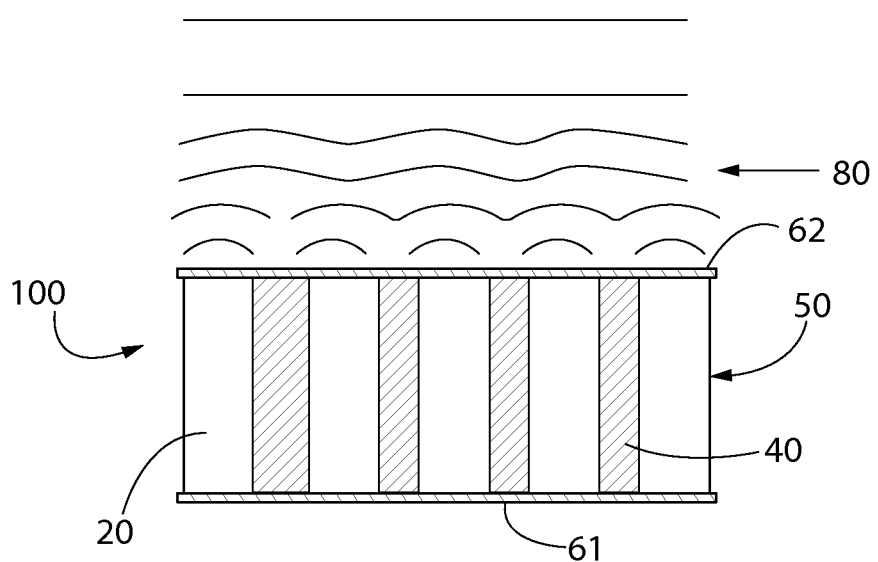
FIG. 4B is a schematic representation of the transducer of FIG. 3F wherein the electrodes are energized so that the individual acoustic energy waves of the pillars effectively combine to form a plane wave profile, according to one embodiment of the present invention.

However, as can be seen in FIG. 4B, the summary effect of the acoustic waves 80 is the launching of a plane wave that is free of nodes of anti-nodes. As the pillars 20 extend in their axial direction (i.e., vertically along their height H) by the piezoelectric effect, the pillars 20 contract by Poisson's ratio in the lateral direct (i.e., horizontally along their width W). Similarly, when the pillars 20 contract in their axial direction by the piezoelectric effect, the pillars 20 expand by Poisson's ratio in the lateral direct. However since the spaces 30 are filled with a resilient material, any waves generated in the lateral direction are greatly dampened or suppressed. This in effect launches the plane wave from the surface of the transducer 100.

As mentioned above, the pillars 20 can be energized independently or grouped in subsets to create acoustically active areas and acoustically inactive areas. Pillars 20 that have no opposing electrodes or do not have their electrodes energized, do not have the piezoelectric effect and do not launch an acoustic wave. Thus the extent of the acoustically active area can be tailored to the precise situation desired. In addition, if areas of the transducer 100 (or assembly in which the device is to be used) are not required to be acoustically active, these sections can have the piezoelectric pillars 20 removed from the composite and filled with a resilient material or left as a void.

Figure 5:
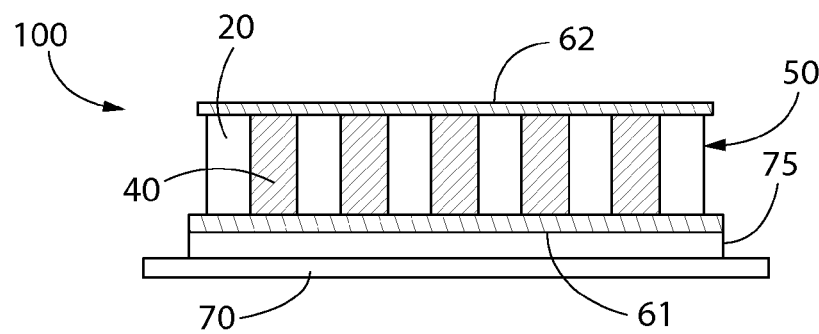
FIG. 5 is a side view of a composite transducer according to one embodiment of the present invention wherein an impedance matching layer has been added.

Referring now to FIG. 5, an embodiment of the transducer 100 is illustrated wherein a matching layer 75 is added between the transmitting structure 70 and the electrode. The matching layer 75 (or layers) are preferably chosen to act as impedance matching layers to reduce energy loss during transmission of acoustic energy to the processing fluid. In other words, the matching layer (75) is designed acoustically so that the acoustic wave is efficiently coupled into the transmission fluid and not reflected at the interface. As an example, a ¼ wave epoxy matching layer (Approximately 0.029") and a very thin polymer (Halar film) which is acoustical transparent can be used as the matching layer 75 and the transmitting structure 70 respectively. In design variations, as the external polymer film thickness is increased and is seen as part of the acoustical layers; then the polymer film is included as a matching layer and all layer thickness and properties are adjusted to efficiently transfer the acoustical energy from the piezoelectric pillars 20 to the processing fluid Referring now to FIG. 6, a transducer 100 having a radius of curvature is illustrated according to one embodiment of the present invention. In certain processing applications of articles, it may be desirable for the transducer 100 to take a curved shape to effectuate acoustic energy control and fluid coupling to the article.

The curved transducer 100 of FIG. 6 can be formed by either forming the composite assembly 50 to have a radius of curvature during the steps discussed above or manipulating the composite assembly 50 subsequent to being formed in a flat shape. The electrodes 61, 62 and the transmitting structure 70 (and any matching layers) can be bonded to the composite assembly 50 before or after the curvature is formed. In FIG. 6, these materials were bonded prior to forming the curvature. As an alternate order of construction, the composite assembly 50 alone can be formed in a curved form and then the electrodes 61, 62 and transmitting structure 70 (and impedance matching layers if any) can be bonded in later steps. The transmitter structure 70 is typically included after the curvature forming process and in the next steps of assembly.

The transmitting structure 70 comprises a convex outer surface 71 and a concave inner surface 72. The transducer 100 is bonded to the concave inner surface 71. As can be seen, the top electrodes 62 are applied as two isolated regions on the top surface of the composite assembly 50. Thus, when the transducer is energized by applying an electrical signal to the electrodes 61, 62, only those pillars 20 covered by the electrodes 62 will generate acoustic energy, thereby resulting in two separate acoustically active regions A, B. Because the central region of the composite assembly 50 does not receive an electric signal as a result of there being no electrode 62 in that region, the pillars 20 in that region do not generate acoustic energy, thereby resulting in an acoustically inactive area C. The acoustically active regions A, B are circumferentially separated by the acoustically inactive area C.

The pattern of the electrodes 61, 62 to create the active piezoelectric pillars 20 can be varied to change the acoustical energy pattern to any desired configuration. Reduced electrode pattern area can also reduce the effective acoustical strength in a given area. In addition, areas of the composite assembly 50 where no acoustical energy is required may be made inactive by not only omitting electrodes in that area, but also may have electrodes that do not receive power, or these areas can have the composite assembly 50 removed and/or left as void or replaced with a resilient material. In alternate embodiments, the piezoelectric pillars 20 can be grouped, and each group would have its own electrode(s) 61, 62 and power/control wire. This would allow each group of pillars 20 to be controlled independently by an outside controller. This allows for each group of pillars to have its own power level, operating frequency, on/off cycle time. In other embodiments, the outer electrode can be divided into multiple regions. Each electrode would have its own power/control wire. This is an alternate method to control the active region(s) of the device.

Figure 7:
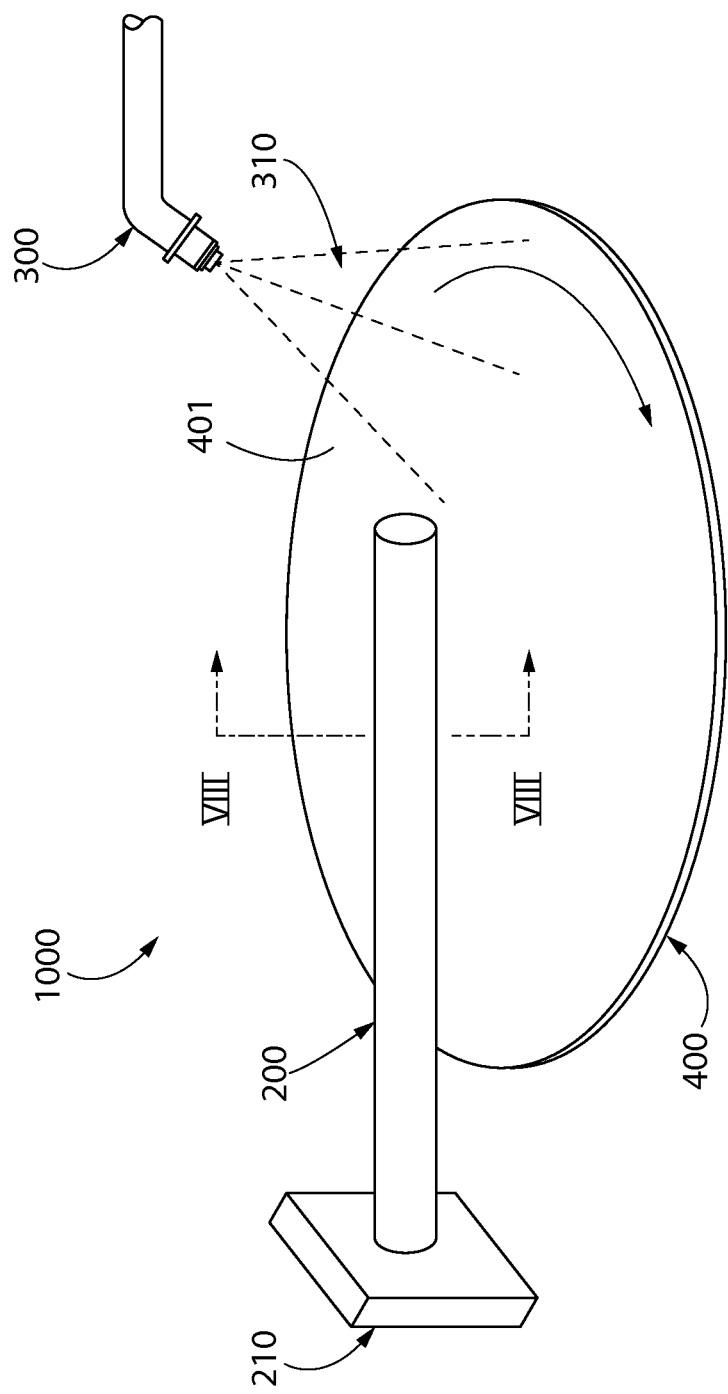
FIG. 7 is a perspective view of an acoustic processing system according to one embodiment of the present invention.

Referring now to FIG. 7, a megasonic system 1000 for processing a flat article 400 is illustrated. The megasonic system 1000 comprises a rotary support (not visible) upon which the article is supported in a generally horizontal orientation and rotated. The megasonic system 1000 also comprises a transducer assembly 200 that is positioned adjacent to and opposing an upper surface 401 of the article 400. The transducer assembly 200 is supported in a cantilevered fashion by the support mechanism, generically illustrated at block 210. If desired, the support mechanism can be capable of translational and/or pivotal movement. The transducer assembly 200 is supported sufficiently close to the surface 401 of the article so that when the dispenser 300 applies a liquid to the surface of the wafer, a liquid film of the liquid couples the transducer assembly 200 to the surface 401 so that acoustic energy generated by the transducer assembly 200 can be transmitted to the article 400. The general concept of such single-article acoustic-assisted processing systems are known in the art and disclosed in such patents at U.S. Pat. No. 6,684,891, to Mario Bran, the entirety of which is incorporated by reference.

The transducer assembly 200 is supported substantially parallel to the surface 401 of the article 400. While the transducer assembly 200 is illustrated as an elongated rod-like probe, the invention is not so limited. It is to be understood that the transducer assembly can take on a wide variety of shapes, orientations, and structural arrangements.

Figure 8:
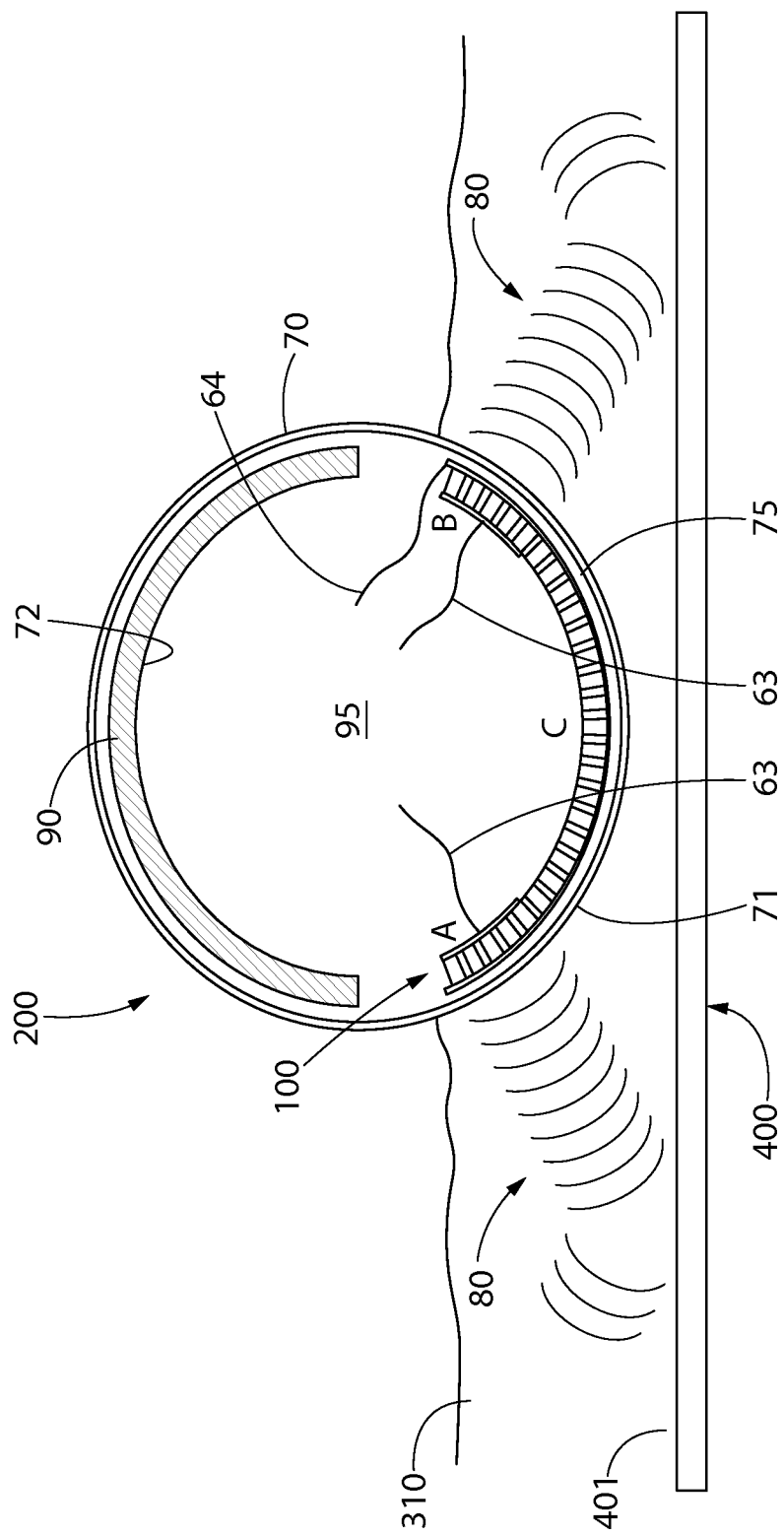
FIG. 8 is a cross-sectional view of the transducer assembly of the acoustic processing system of FIG. 7 along perspective VIII-VIII.

Referring now to FIG. 8, a cross-sectional view of the transducer assembly 200 is illustrated. The transducer assembly 200 incorporates the curved transducer described in FIG. 6 above except that a impedance matching layer 75 has been incorporated and the transmitting structure 70 is in the shape of a tubular element. In this embodiment, the transmitting structure 70 is a protective polymer film extended over a supporting structure 90 that plays no role acoustically in the device, but supplies rigidity and structural integrity. In an alternative embodiment, the transmitting structure 70 can be constructed of a material and/or thickness that is sufficiently rigid to provide the necessary structural integrity for supporting. For example, the transmitting structure 70 can be constructed of quartz, sapphire, fused silica, or other materials that are inert to the chemicals and/or liquid used in the processes.

The transmitting structure 70 is the form of a cylindrical tube and comprises an outer surface 71 and inner surface 72. Of course, the transmitting structure 70 can take other curved embodiments, such as a lens, a curved plate, a par-cylindrical trough, etc.

Electrical wires 63, 64 are operably connected to the electrodes 61, 62 and routed through the transducer assembly 200 to the outside where they are connected to a source of an electrical signal. The source of electricity provides an electrical signal that drives the piezoelectric pillars 20 located in the active areas A, B of the composite transducer 100 to generate waves 80 of acoustic energy. Preferably, the wave 80 of acoustic energy have a frequency that is in the megasonic range, and more preferably between 500 KHz and 5 MHz.

The composite transducer 100 is bonded to the inner surface 71 of the transmitting structure 70 at the bottom circumferential portion so that the waves 80 of acoustic energy generated by the acoustically active sections A, B of the composite transducer 100 are transmitted into the layer of liquid 310 on the article surface 401. Through a combination of the rotational orientation of the transducer assembly 200 and the circumferential spacing between the acoustically active sections A, B of the piezoelectric pillars 20, the plane waves 80 of acoustic energy are transmitted through the liquid layer 310 to the surface 401 of the article 400 at an angle so that the waves 80 do not reflect back into the transducer assembly 200. Instead, the waves 80 reflect off the article 400 and angle harmlessly away from the transducer assembly 200.

In other words, by having only those pillars 20 on the two upper edges electrically active, acoustic waves launched from these pillars 20 do not reflect back to the transducer 100, thereby suppressing standing waves. The pillars 20 that would generate a standing wave (those in acoustically inactive region C) are not electrically connected with electrodes.

The transmitting structure 70 forms an internal cavity 95, may be left as a void filled with air or another gas, or optionally may be filled with a dampening material which dampens acoustic energy that may be applied to the backside of the transducer 100 inside of this construction. The presence of a dampening material suppresses any undesirable acoustical energy. The transmitting structure 70 is sealed such that the liquid 310 cannot breach the cavity 95 and the material inside of the cavity 95 cannot get outside to contaminate the liquid 310 and potentially the article, which may be a semiconductor wafer or solar panel having delicate structures.

It may also be desirable to have the outer surface of the transmitting structure 70 treated or altered to have a low surface tension toward the transmission liquid 310 so at least partial wetting occurs. Air pockets, bubbles or voids will cause reflections of acoustical energy back to the transducer.

Referring to FIGS. 7 and 8 concurrently, a method of cleaning a semiconductor wafer 400 using the system 1000 will be described. First, a semiconductor wafer 400 is positioned on the rotatable support where it is supported in a generally horizontal orientation. The wafer 400 is then rotated, as indicated by the arrow. A liquid medium 310 is then dispensed via the dispenser 300 onto the top surface 401 of the wafer 400. The liquid can be any chemical, solution or the like used in processing wafers, such as DI water, SC1, SC2 ozonated DI water, etc.

The transducer assembly 200 is positioned adjacent the surface 401 of the wafer so that a small gap exists between the bottom of the transmitting structure 70 and the surface 401 of the wafer 400. The transducer assembly is just larger than a radius of the wafer 400. For example, for a 300 mm silicon wafers, the transducer assembly 200 would be rod like 240 mm long rod with 150 mm of active acoustical length.

As the wafer 400 rotates, the liquid 310 supplied to the surface 401 forms a layer of liquid 310 that fluidly couples the transducer assembly 200 to the wafer 400. Electricity is then supplied via the wires, 63, 64 to excite the pillars 20 in the active regions A, B, thereby generating acoustic energy waves 80 at the desired frequency and power level. The waves 80 of acoustic energy are then transmitted outward through the transducer assembly 200 in an angled manner and enter the liquid layer 310, eventually contacting the wafer surface 401. Rotating the wafer 400 on the chuck beneath the transducer assembly 200 provides complete acoustic coverage of the surface 401. The acoustic energy waves 80 dislodge particles from the wafer surface 401, thereby effectuating cleaning.

Figure 9:
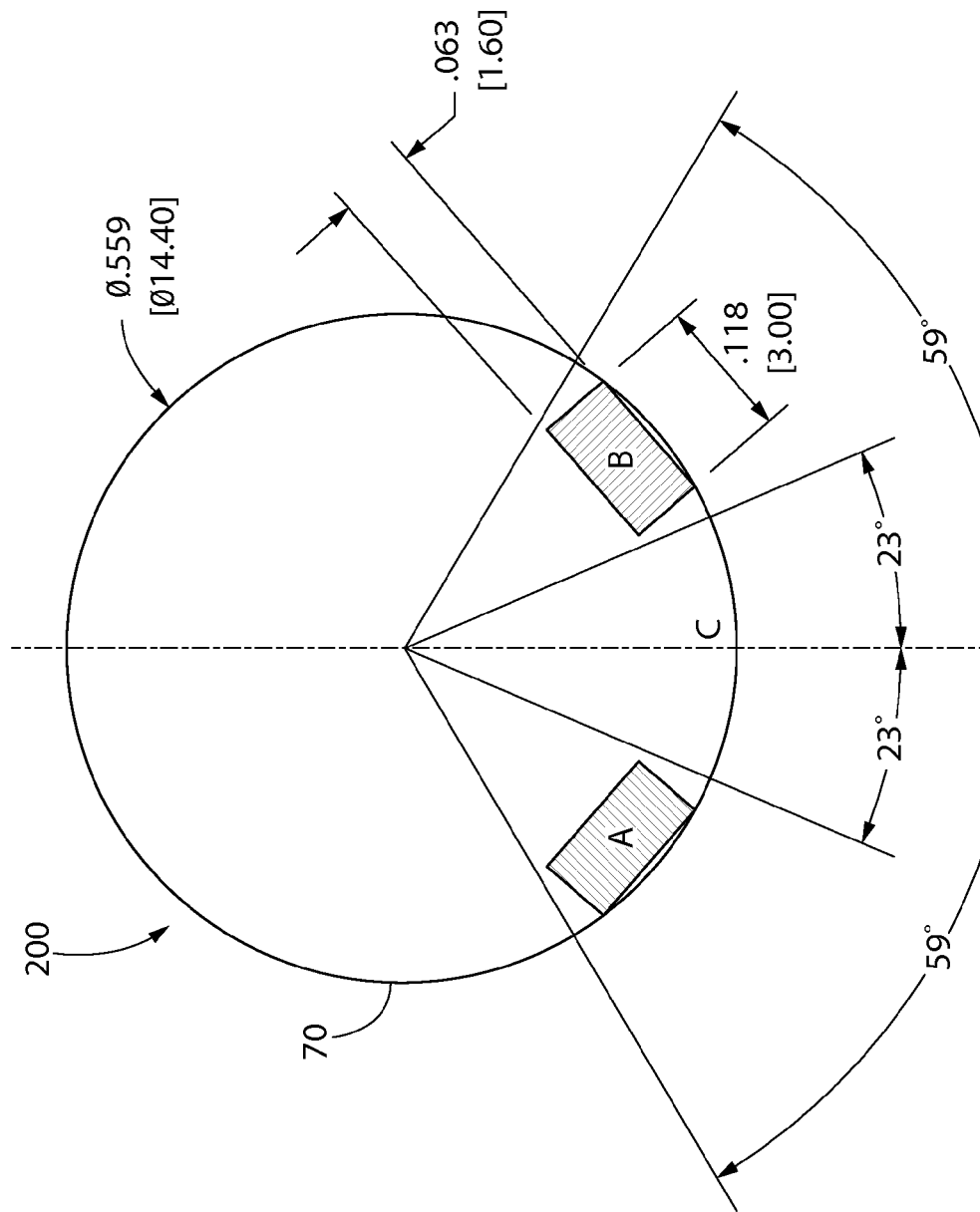
FIG. 9 is a diagram of the transducer assembly of FIG. 8 showing one set of preferred dimensions.

As shown in FIG. 9, the acoustically active areas A, B are separated by an acoustically inactive area C of at least 45 degrees or more. This ensures that the waves 80 do not reflect back into the transducer assembly 200. Of course, the size of the inactive area C will be dictated by the curvature of the structure and other characteristics. Furthermore, while the inner and outer surfaces 71, 72 of the transmitting structure 70 are shown as curved surfaces, it is possible that the angled wave application technique of the present invention can be accomplished by using planar surfaces that are angled to one another. Thus, the terms curved, convex, and concave are intended to cover embodiments wherein planar surface are angularly oriented with respect to one another to achieve the same effect.

Figure 10:
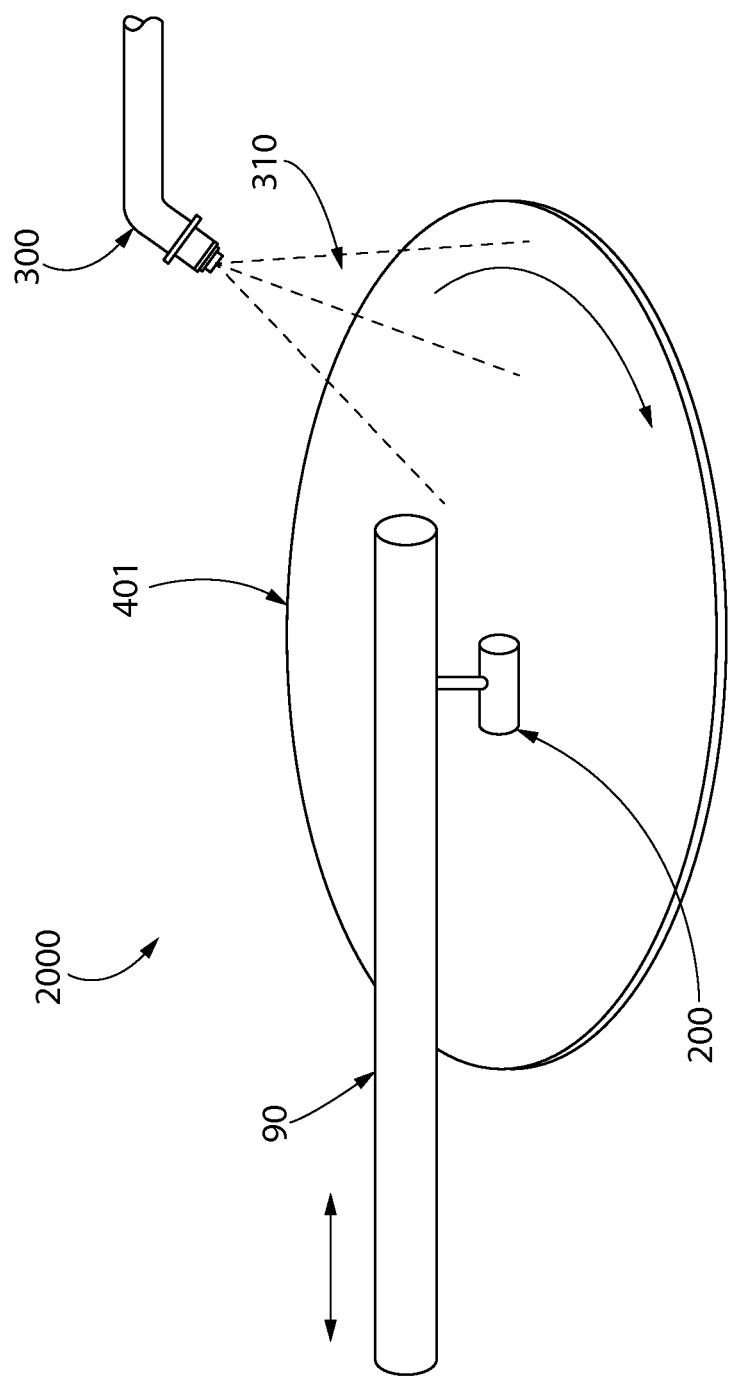
FIG. 10 is a perspective view of an acoustic processing system according to a second embodiment of the present invention wherein a small composite transducer assembly is moved across the surface of a wafer by a support rod.

Referring now to FIG. 10, a second embodiment of a system 2000 according to the present invention is illustrated. In this embodiment, the composite transducer assembly 200 is a short segment of the transducer assembly of the first system 1000. This short segment transducer 200 is attached to a support arm 90 that traverses the rotating chuck in a radial manner. The radial scan can be programmed to account for the area of the wafer increasing as the transducer moves toward the outer edge. The acoustical transmission media 310 would be dispensed onto the wafer surface 401 as set forth above to achieve the fluid coupling. The acoustical device 200 would be rod like 24 mm long with 20 mm of active acoustical length.

Figure 11:
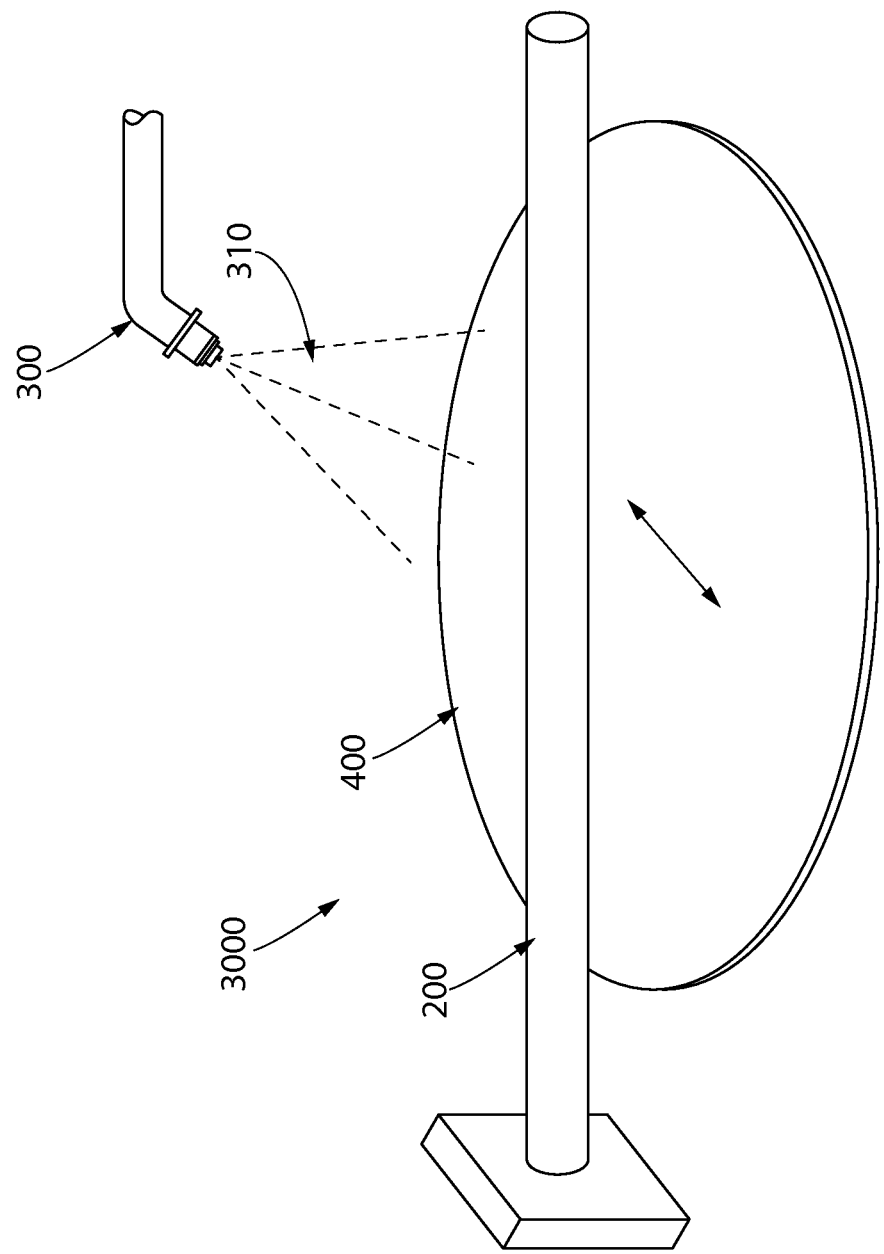
FIG. 11 is a perspective view of an acoustic processing system according to a third embodiment of the present invention wherein a composite transducer assembly extends across the entire diameter of a wafer.
Figure 12:
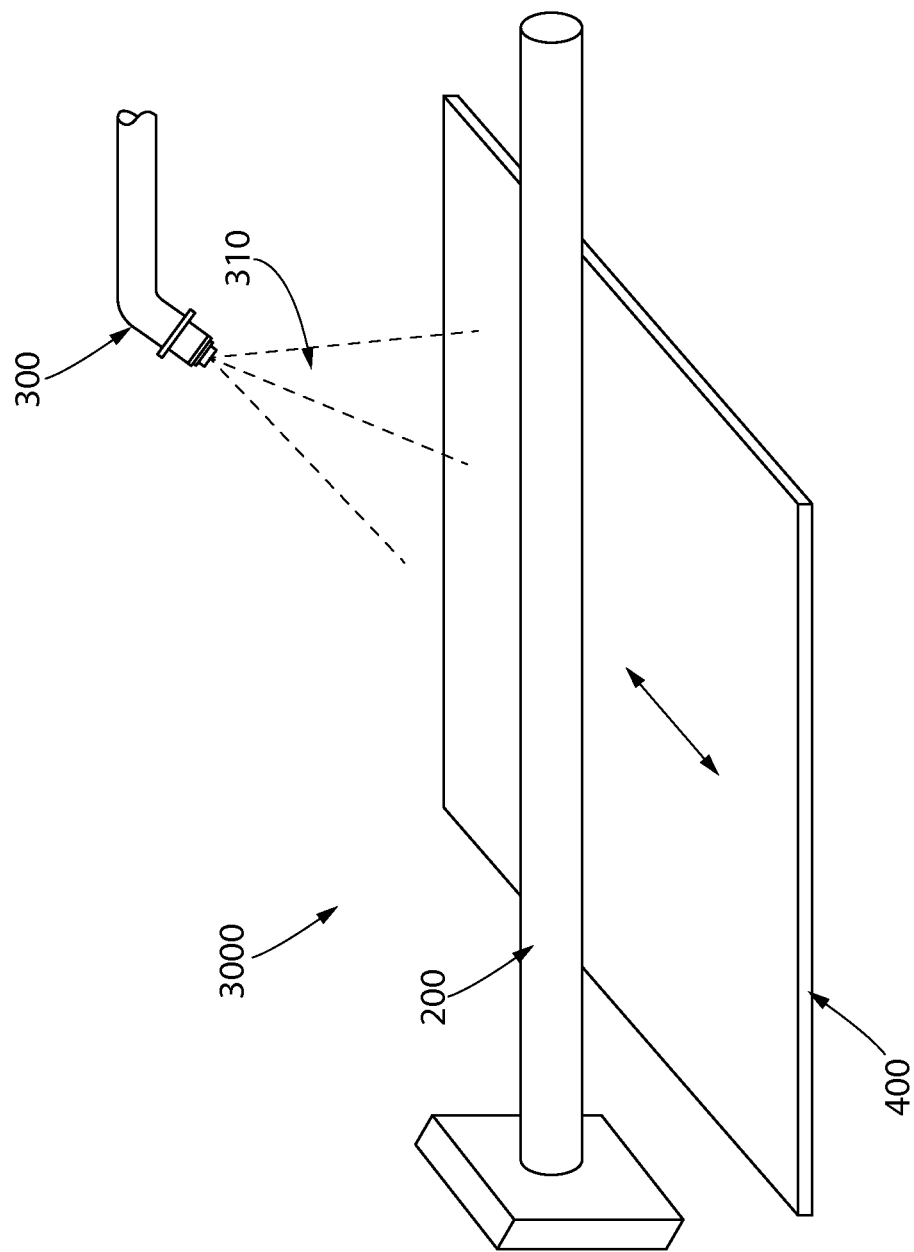
FIG. 12 is a perspective view of the acoustic processing system of FIG. 11 processing a rectangular panel.

Referring now to FIGS. 11-12, a third embodiment of a system 3000 according to the present invention is illustrated processing articles of different shape. In this embodiment, the composite transducer 200 is a full diameter (or width) of the object 400 to be treated. The transducer 200 could be held in place and the object (wafer, plate etc.) could be linearly scanned beneath the transducer 200. The acoustical transmission media would be dispensed onto the wafer/plate surface.

Figure 13:
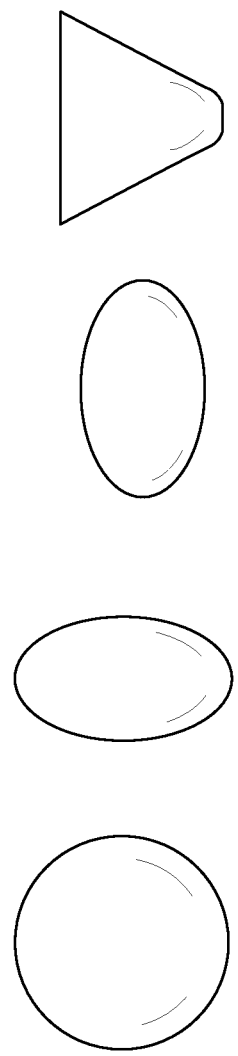
FIG. 13 is an illustration of different shapes in which a curved composite transducer according to the present invention can be constructed.
Figure 14:
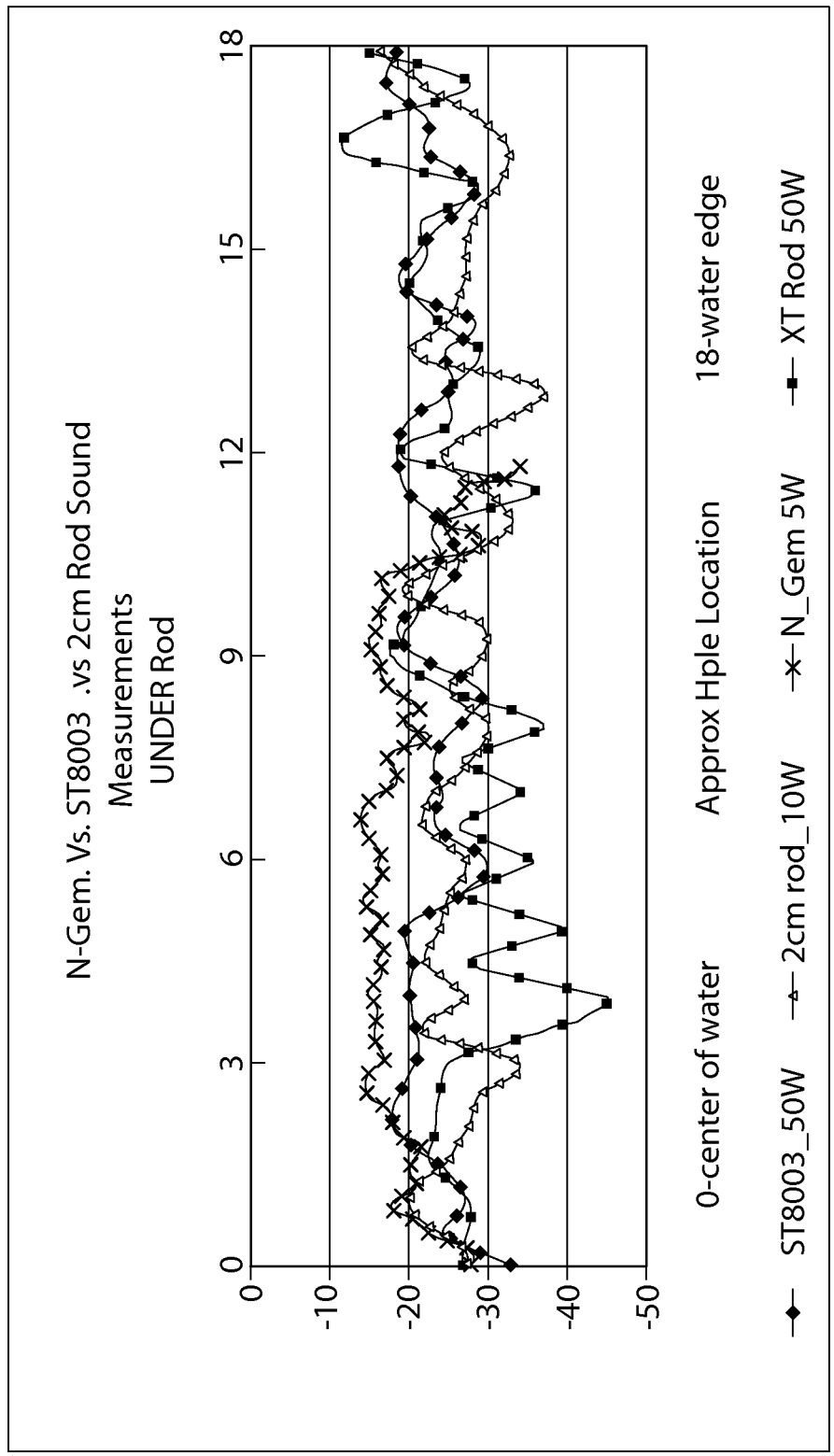
FIG. 14 is a graph comparing acoustic levels generated at various distances along a wafer for a transducer assembly according to the present invention and three prior art transducer configurations.

In each instance the desired goal is to suppress structure damage from the acoustic energy applied to the surface, yet having sufficient energy to remove particles. Using composite piezoelectric material, it is also possible to make a transducer that is made up of many segments (extending the composite pattern) so that the length can be any dimension in principal. Furthermore, the general shape is not required to be a round rod, alternative variations in the shape of the device can enhance the characteristics of the device, as shown in FIG. 13.

The foregoing description of the preferred embodiment of the invention has been presented for the purpose of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

II.

Section II discusses a second group of embodiments, shown in FIGS. 15-28.

Figure 15:
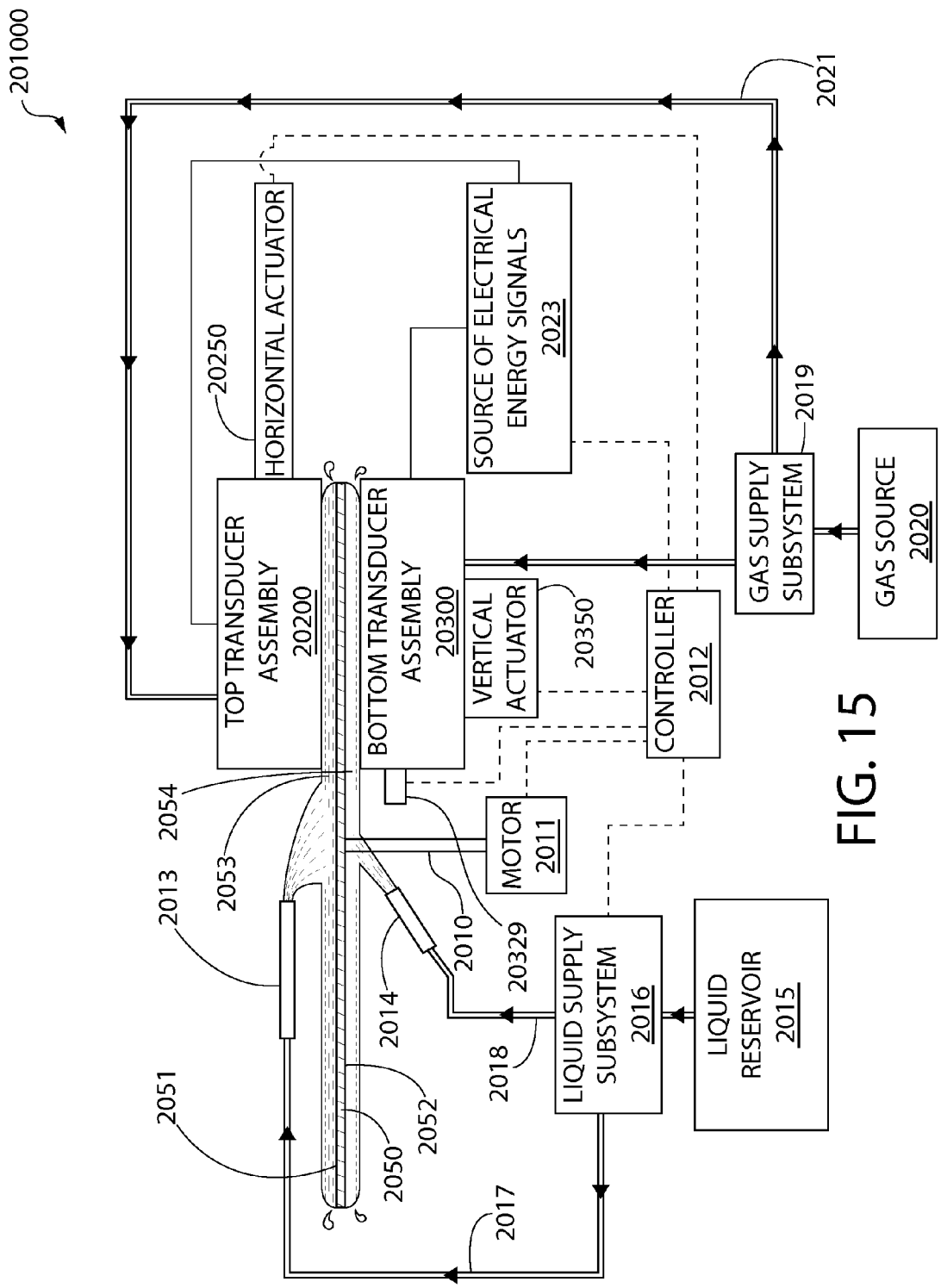
FIG. 15 is schematic of an acoustic energy cleaning system according to another embodiment of the present invention.

Referring first to FIG. 15, a schematic of an acoustic energy cleaning system 201000 (hereinafter referred to as "cleaning system 201000") is illustrated according to one embodiment of the present invention. For ease of discussion the inventive system and methods of the drawings will be discussed in relation to the cleaning of semiconductor wafers. However, the invention is not so limited and can be utilized for any desired wet processing of any flat article.

The cleaning system 201000 generally comprises a top transducer assembly 20200, bottom transducer assembly 20300 and a rotatable support 2010 for supporting a semiconductor wafer 2050 in a substantially horizontal orientation. Preferably, the semiconductor wafer 2050 is supported so its top surface 2051 is the device side of the wafer 2050 while the bottom surface 2052 is the non-device side. Of course, the wafer can be supported so that its top surface 2051 is the non-device side while the bottom surface 2052 is the device side if desired.

The rotatable support 2010 is designed to contact and engage only a perimeter of the substrate 2050 in performing its support function. However, the exact details of the structure of the rotatable support 2010 are not limiting of the present invention and a wide variety of other support structures can be used, such as chucks, support plates, etc. Additionally, while it is preferred that the support structure support and rotate the semiconductor wafer in a substantially horizontal orientation, in other embodiments of the invention, the system may be configured so that the semiconductor wafer is supported in other orientations, such as vertical or at an angle. In such embodiments, the remaining components of the cleaning system 201000, including the transducer assemblies 20200, 20300, can be correspondingly repositioned in the system so as to be capable of performing the desired functions and/or the necessary relative positioning with respect to other components of the system as discussed below.

The rotary support 2010 is operably coupled to a motor 2011 to facilitate rotation of the wafer 2050 within the horizontal plane of support. The motor 2011 is preferably a variable speed motor that can rotate the support 2010 at any desired rotational speed ω. The motor 2011 is electrically and operably coupled to the controller 2012. The controller 2012 controls the operation of the motor 2011, ensuring that the desired rotational speed w and desired duration of rotation are achieved.

The cleaning system 201000 further comprises a top dispenser 2013 and a bottom dispenser 2014. Both the top dispenser 2013 and the bottom dispenser 2014 are operably and fluidly coupled to a liquid supply subsystem 2016 via liquid supply lines 2017, 2018. The liquid supply subsystem 2016 is in turn fluidly connected to the liquid reservoir 2015. The liquid supply subsystem 2016 controls the supply of liquid to both the top dispenser 2013 and the bottom dispenser 2014.

The liquid supply subsystem 2016, which is schematically illustrated as a box for purposes of simplicity, comprises the desired arrangement of all of the necessary pumps, valves, ducts, connectors and sensors for controlling the flow and transmission of the liquid throughout the cleaning system 201000. The direction of the liquid flow is represented by the arrows on the supply lines 2017, 2018. Those skilled in the art will recognize that the existence, placement and functioning of the various components of the liquid supply subsystem 2016 will vary depending upon the needs of the cleaning system 201000 and the processes desired to be carried out thereon, and can be adjusted accordingly. The components of the liquid supply subsystem 2016 are operably connected to and controlled by the controller 2012.

The liquid reservoir 15 holds the desired liquid to be supplied to the wafer 2050 for the processing that is to be carried out. For cleaning system 201000, the liquid reservoir 2015 will hold a cleaning liquid, such as for example deionized water ("DIW"), standard clean 1 ("SC1"), standard clean 2 ("SC2"), ozonated deionized water ("DIO$_3$"), dilute or ultra-dilute chemicals, and/or combinations thereof. As used herein, the term "liquid" includes at least liquids, liquid-liquid mixtures and liquid-gas mixtures. It is also possible for certain other supercritical and/or dense fluids to qualify as liquids in certain situations.

Furthermore, it is possible to have multiple liquid reservoirs. For example, in some embodiments of the invention, the top dispenser 2013 and the bottom dispenser 2014 can be operably and fluidly coupled to different liquid reservoirs. This would allow the application of different liquids to the bottom surface 2052 and the top surface 2051 of the wafer 2050 if desired.

The cleaning system 201000 further comprises a gas supply subsystem 2019 that is operably and fluidly coupled to a gas source 2020. The gas supply subsystem 2019 is operably and fluidly connected to the top transducer assembly 20200 via the gas supply line 2021 and to the bottom transducer assembly 20300 via the gas supply line 2022. The gas supply subsystem 2019, which is schematically illustrated as a box for purposes of simplicity, comprises the desired arrangement of all of the necessary pumps, valves, ducts, connectors and sensors for controlling the flow and transmission of the gas throughout the cleaning system 201000. The direction of the gas flow is represented by the arrows on the supply lines 2021, 2022. Those skilled in the art will recognize that the existence, placement and functioning of the various components of the gas supply subsystem 2019 will vary depending upon the needs of the cleaning system 201000 and the processes desired to be carried out thereon, and can be adjusted accordingly. The components of the gas supply subsystem 2019 are operably connected to and controlled by the controller 2012. Thus, the transmission of gas from the gas supply subsystem 2019 is based upon signals received from the controller 2012.

As will be described in greater detail below, the gas is supplied to the top and bottom transducer assemblies 20200, 20300 to provide cooling and/or purging to the transducers in the assemblies 20200, 20300 that convert the electrical energy into the acoustic energy. The gas source 2020 preferably holds an inert gas, such as nitrogen, helium, carbon dioxide, etc. However, the invention is not limited to the use of any specific gas. Furthermore, as with the liquids, it is possible to have multiple gas sources. For example, in some embodiments of the invention, the top transducer assembly 20200 and the bottom transducer assembly 20300 can be operably and fluidly coupled to different gas reservoirs. This would allow the application of different gases as desired.

The cleaning system 201000 further comprises a horizontal actuator 20250 that is operably coupled to the top transducer assembly 20200 and a vertical actuator 20350 that is operably coupled to the bottom transducer assembly 20300. The actuators 20250, 20350 are operably coupled to and controlled by the controller 2012. The actuators 20250, 20350 can be pneumatic actuators, drive-assembly actuators, or any other style desired to effectuate the necessary movement.

The horizontal actuator 20250 can horizontally translate the top transducer assembly 20200 between a retracted position and a processing position. When in the retracted position, the top transducer assembly 20200 is withdrawn sufficiently away from the rotatable support 2010 so that the wafer 2050 can be loaded and unloaded without obstruction onto and from the support 2010. When in the processing position, at least a portion of the top transducer assembly 20200 is spaced from but sufficiently close to the top surface 2051 of the wafer so that when liquid is supplied to the top surface 2051 of the wafer 2050, a meniscus of liquid is formed between the top surface 2051 of the wafer 2050 and that portion of the top transducer assembly 20200. In FIG. 15, the top transducer assembly 20200 is in the processing position.

Similarly, the vertical actuator 20350 can vertically translate the bottom transducer assembly 20300 between a retracted position and a processing position. For the bottom transducer assembly 20300, the retracted position is a lowered position where the wafer 2050 can be safely loaded onto the support 2050 without contacting the bottom transducer assembly 20300 and/or interfering with other processes that may be carried out on the bottom surface 2052 of the wafer 2050 that require additional space. When the bottom transducer assembly 20300 is in its processing position, at least a portion of the bottom transducer assembly 20300 is spaced from but sufficiently close to the bottom surface 2052 of the wafer 2050 so that when liquid is supplied to the bottom surface 2052 of the wafer 2050, a meniscus of liquid is formed between the bottom surface 2052 of the wafer 2050 and that portion of the top transducer assembly 20200. In FIG. 15, the bottom transducer assembly 20300 is in the processing position.

While the actuators 20250, 20350 are exemplified in system 201000 as being horizontal and vertical actuators respectively, in other embodiments of the invention, different styles of actuators can be used in the place of each. For example the actuator operably coupled to the bottom transducer assembly 20300 can be a horizontal, vertical, angled translation actuator or a pivotable actuator. The same options exist for the actuator operably coupled to the top transducer assembly 20200.

A position sensor 20329 is provided in the cleaning system 201000 so that the position of the bottom transducer assembly 20300 can be monitored and controlled effectively. The position sensor 20329 measures the distance between the bottom transducer assembly 20300 and the bottom surface 2052 of the wafer 2050 so that the proper distance between the two can be achieved to effectuate the proper processing gap for formation of the liquid meniscus. The position sensor 20329 is operably and communicably coupled to the controller 2012. More specifically, the position sensor 20329 generates a signal indicative of the measured distance and transmits this signal to the controller 2012 for processing. While the sensor 20329 is illustrated as being connected to the bottom transducer assembly 20300, it can be mounted almost anywhere in the cleaning system 201000 so long as it can perform its position indicating function.

The cleaning system 201000 also comprises an electrical energy signal source 2023 that is operably coupled to the top transducer assembly 20200 and the bottom transducer assembly 20300. The electrical energy signal source 2023 creates the electrical signal that is transmitted to the transducers (discussed later) in the top transducer assembly 20200 and the bottom transducer assembly 20300 for conversion into corresponding acoustic energy. The desired electrical signals can be sent to the top and bottom transducer assemblies 20200, 20300 concurrently, consecutively and/or in an alternating fashion, depending on the process needs. The electrical energy signal source 2023 is operably coupled to and controlled by the controller 2012. As a result, the controller 2012 will dictate the frequency, power level, and duration of the acoustic energy generated by the top transducer assembly 20200 and the bottom transducer assembly 20300. Preferably, the electrical energy signal source 2023 is controlled so that the acoustic energy generated by the top transducer assembly 20200 and the bottom transducer assembly 20300 has a frequency in the megasonic range.

Depending on system requirements, it may not be desirable to use a single electrical energy signal source to control both the top transducer assembly 20200 and the bottom transducer assembly 20300. Thus, in other embodiments of the invention, multiple electrical energy signal sources may be used, one for each transducer assembly.

The controller 2012 may be a processor, which can be a suitable microprocessor based programmable logic controller, personal computer, or the like for process control. The controller 2012 preferably includes various input/output ports used to provide connections to the various components of the cleaning system 201000 that need to be controlled and/or communicated with. The electrical and/or communication connections are indicated in dotted line in FIG. 15. The controller 2012 also preferably comprises sufficient memory to store process recipes and other data, such as thresholds inputted by an operator, processing times, rotational speeds, processing conditions, processing temperatures, flow rates, desired concentrations, sequence operations, and the like. The controller 2012 can communicate with the various components of the cleaning system 201000 to automatically adjust process conditions, such as flow rates, rotational speed, movement of the components of the cleaning system 201000, etc. as necessary. The type of system controller used for any given system will depend on the exact needs of the system in which it is incorporated.

The top dispenser 2013 is positioned and oriented so that when a liquid is flowed therethough, the liquid is applied to the top surface 2051 of the substrate 2050. When the substrate 2050 is rotating, this liquid forms a layer or film of the liquid across the entirety of the top surface 2051 of the substrate 2050. Similarly, the bottom dispenser 2014 is positioned and oriented so that when a liquid is flowed therethough, the liquid is applied to the bottom surface 2052 of the substrate 2050. When the substrate 2050 is rotating, this liquid forms a layer or film of the liquid across the entirety of the bottom surface 2052 of the substrate 2050.

The top transducer assembly 20200 is positioned so that a small gap exists between a portion of the top transducer assembly 20200 and the top surface of the wafer 2050. This gap is sufficiently small so that when the liquid is applied to the top surface 2051 of the wafer 2050, a meniscus of liquid is formed between the top surface 2051 of the wafer 2050 and the portion of the top transducer assembly 20200. Similarly, the bottom transducer assembly 20300 is positioned so that a small gap exists between a portion of the bottom transducer assembly 20300 and the bottom surface 2052 of the wafer 2050. This gap is sufficiently small so that when the liquid is applied to the bottom surface 2052 of the wafer 2050, a meniscus of liquid is formed between the bottom surface 2052 of the wafer 2050 and the portion of the bottom transducer assembly 20300. The meniscus is not limited to any specific shape.

As will be noted, the top and bottom transducer assemblies 20200, 20300 are generically illustrated as boxes. This is done because, in its broadest sense, the invention is not limited to any particular structure, shape and/or assembly arrangement for the transducer assemblies 20200, 20300. For example, any of the transducer assemblies disclosed in U.S. Pat. No. 6,039,059 ("Bran"), issued Mar. 21, 2000, U.S. Pat. No. 7,145,286 ("Beck et al."), issued Dec. 5, 2006, U.S. Pat. No. 6,539,952 ("Itzkowitz"), issued Apr. 1, 2003, and United States Patent Application Publication 2006/0278253 ("Verhaverbeke et al."), published Dec. 14, 2006, can be used as the top and/or bottom transducer assembly 20200, 20300. Of course, other styles of transducer assemblies can be used, such as those having an elongated transmitter rod supported at an angle to the surface of the wafer.

Figure 16:
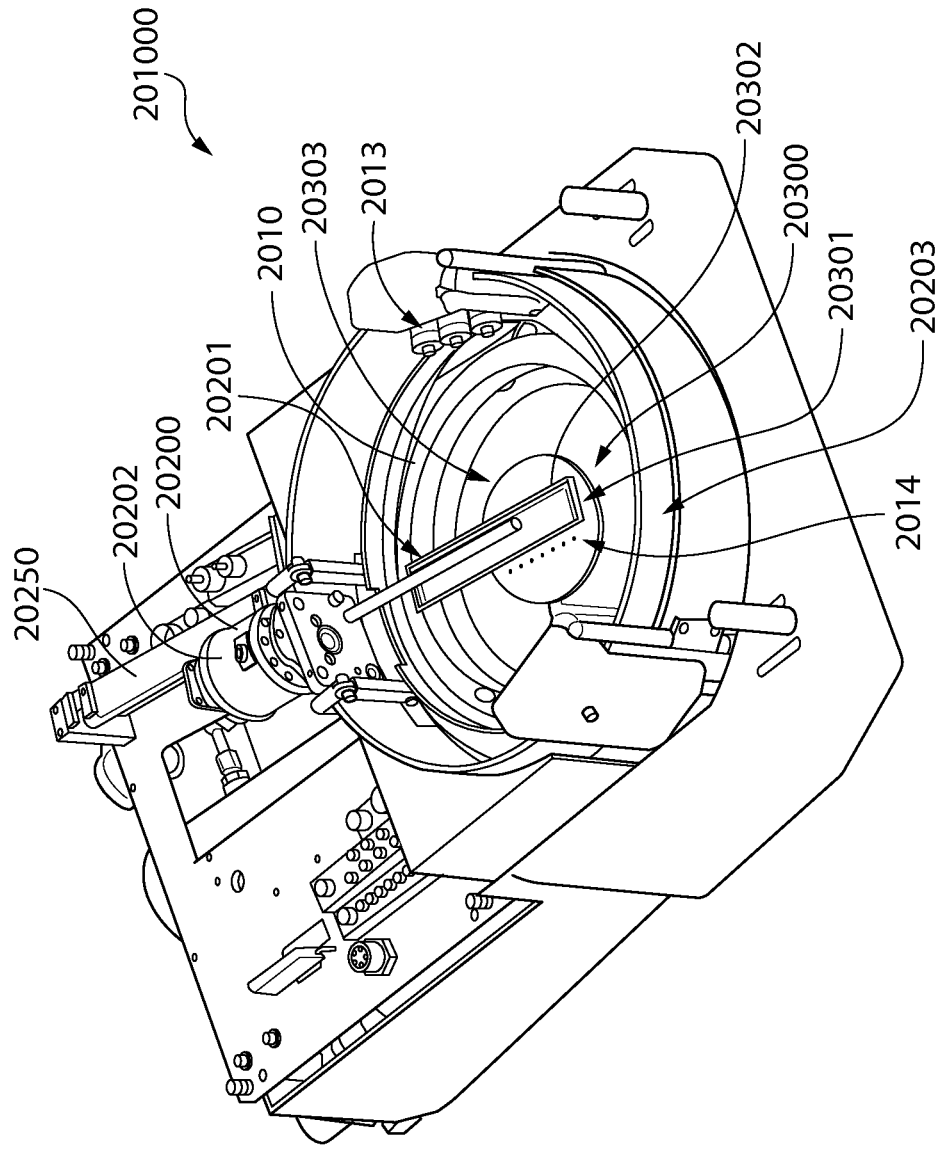
FIG. 16 is a perspective view of one structural embodiment of the acoustic energy cleaning system of FIG. 15.

Referring now to FIG. 16, a preferred structural embodiment of the cleaning system 201000 is illustrated. Like numbers are used in FIGS. 16-28 to indicate the corresponding structural manifestation of the schematically illustrated components of FIG. 15.

In the cleaning system 201000 of FIG. 16, the top transducer assembly 20200 comprises an elongate rod-like transmitter 20201 that is acoustically coupled to a transducer 20203 (visible in FIG. 17) that is located within housing 20202. Many of the details of this style of elongate rod-like transmitter 20201 are disclosed in U.S. Pat. No. 6,684,891 ("Bran"), issued Feb. 3, 2004 and U.S. Pat. No. 6,892,738 ("Bran et al."), issued May 17, 2005, the entireties of which are hereby incorporated by reference. The top transducer assembly 20200 is operably coupled to drive assembly/actuator 20250 that can move the rod-like transmitter 20201 between a retracted position and a processing position. When the rod-like transmitter 20201 is in the retracted position, the rod-like transmitter 20201 is located outside of the process bowl 20204 so that a wafer 2050 can be placed on the rotatable support 2010 without obstruction. More specifically, the drive assembly 20250 withdraws the rod-like transmitter 20201 through an opening in a side wall of the process bowl 20204. When in the processing position, the rod-like transmitter 20201 is position directly above the top surface 2051 of a wafer 2050 on the rotatable support 2010. The rod-like transmitter 20201 is in the processing position in FIG. 16.

The bottom transducer assembly 20300 is located at the bottom of the process bowl 20204 at a position below the rotatable support 2010. The bottom transducer assembly 20300 comprises a dam 20301, a transmitter 20302 and a base 20303. The bottom dispenser 2014 is in the form of a plurality of sprayers located within the base 20303 itself, rather than a single nozzle dispenser.

Figure 17:
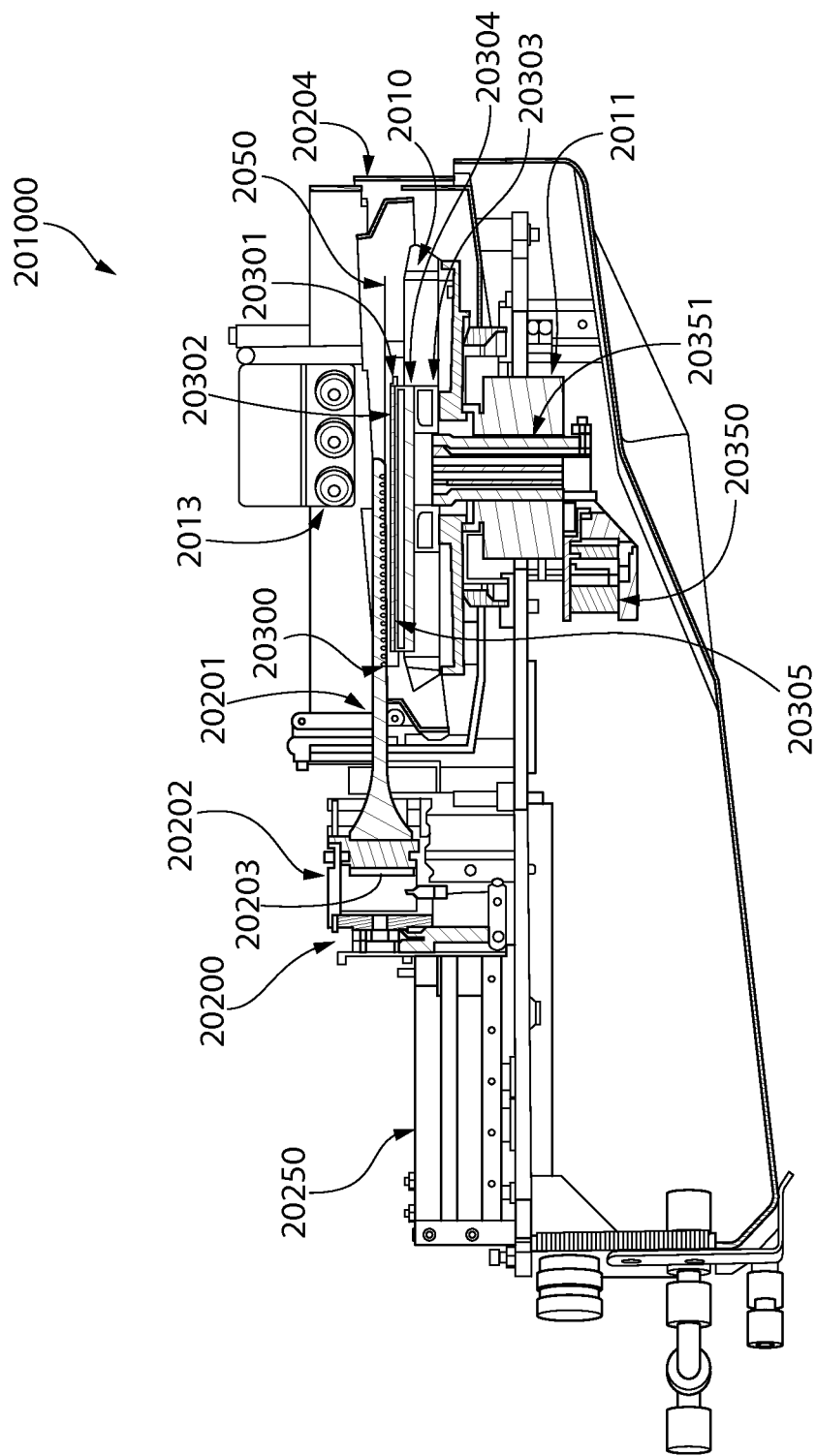
FIG. 17 is a cross-sectional side view of the acoustic energy cleaning system of FIG. 16.

Referring now to FIG. 17, it can be seen that the rotatable support 2010 is located within the process bowl 20204. The rotatable support 2010 supports a wafer 2050 in a substantially horizontal orientation in the gaseous atmosphere of the process bowl 20204, which surrounds the periphery of the wafer 2050. The rotatable support 2010 is operably connected to the motor assembly 2011. The motor assembly rotates the wafer about the central axis. The motor assembly 2011 can be a direct drive motor or a bearing with offset belt/pulley drive.

The rotatable support 2010 supports the wafer 2050 at an elevation and position between the elongate rod-like transmitter 20201 of the top transducer assembly 20200 and the transmitter 20302 of the bottom transducer assembly 20300. When the wafer 2050 is so supported, the transmitter 20201 of the top transducer assembly 20200 extends in a substantially parallel orientation over the top surface 2051 of the wafer 2050 in a close spaced relation. Similarly, the transmitter 20302 of the bottom transducer assembly 20300 extends in a substantially parallel orientation below the bottom surface 2052 of the wafer 2050 in a close spaced relation. These close spaced relations are such that when liquid is applied to the top and bottom surfaces 2051, 2052 from the dispensers 2013, 2014 respectively, meniscuses of liquid are respectively formed between a portion of the transmitter 20201 and the top surface 2051 of the wafer 2050 and between a portion of the transmitter 20302 and the bottom surface 2052 of the wafer 2050.

The bottom transducer assembly 20300 is operably connected to the lifter/actuator 20350. The lifter/actuator 20350 can be a pneumatic lifter and can also comprise brackets. The lifter 20350 can move the bottom transducer 20300 assembly between a processing position and a retracted position. In FIG. 17, the bottom transducer assembly 20300 is in the processing position, which is a raised position in which the transmitter 20302 is in the close spaced relation discussed above. When in the retracted position, the bottom transducer assembly 20300 is in a lowered position to ensure that the wafer 2050 is not damaged during insertion onto the rotatable support 2010.

The transducers 20203, 20305 of the top and bottom transducer assemblies 20200. 20300 are acoustically coupled to the transmitter 20201, 20302 respectively. This can be done through a direct bonding or an indirect bonding that utilizes intermediary transmission layers. The transducers 20230, 20305 are operably coupled a source of an electrical energy signal. The transducers 20203, 20305 can be a piezoelectric ceramic or crystal, as is well known in the art.

Referring now to FIGS. 18-21 concurrently, the bottom transducer assembly 20300 is illustrated removed from the cleaning system 201000 so that its details are visible. It should be understood that the bottom transducer assembly 20300, in of itself, is a novel device that can constitute an embodiment of the invention.

The bottom transducer assembly 20300 comprises a base structure 20303, a housing 20304, a transmitter 20302, a transducer 20305 and a dam 20301. The base structure 20303 is preferably made of PTFE or other non-contaminating material that is suitable rigid. The base structure 20303 has a top convex surface that is a generally par-spherical shaped. The base structure 20303 connects to and supports the remaining components of the bottom transducer assembly 20300. The base structure 20303 also comprises a plurality of liquid dispensing holes/nozzles 2014 that are adapted to supply a film of liquid to the bottom surface of a wafer during processing. The holes/nozzles 2014 are located on both sides of the transmitter 20302 in two separate rows that extend along the length of the transmitter 20302.

The transmitter 20302 is a generally par-cylindrical shaped plate having a convex outer surface 20306 and a concave inner surface 20307. The transmitter 20302, however, can take on a wide variety of other shapes and sizes. The transmitter 20302 can be constructed of any material that transmits acoustic energy generated by the transducer 20305, including without limitation quartz, sapphire, boron nitride, plastic, and metals. One suitable metal is aluminum.

The outer convex surface of the transmitter 20302 terminates in an apex 20313. Because the transmitter 20302 is a par-cylindrical shape, this apex 20313 (FIG. 21) forms an elongate edge along 20314 along the length of the transmitter. Of course, as used herein, the term elongate edge is not limited to the apex of an elongated curved surface but also includes, among other things, the meeting of two surfaces. Furthermore, in other embodiments, the transmitter 20302 may be spherical in nature, thus, the apex could be a point.

The transducer 20305 is a curved plate having a convex upper surface 20308 and concave lower surface 20309. The construction of transducers that convert electrical energy into acoustical energy is very well known in the art. The convex surface 20308 of the transducer has a curvature that generally corresponds to the curvature of the inner concave surface 20307. The transducer 20305 is acoustically coupled to the transmitter 20302 so that acoustic energy generated by the transducer 20305 propagates through the transmitter 20302 and to the wafer 2050. More specifically, the convex upper surface 20308 of the transducer 20305 is bonded to the concave inner surface 20307 of the transmitter. This bonding can be a direct bonding between the surfaces 20307, 20308 or can be an indirect bonding utilizing intermediary transmission layers. In other embodiments, the transducers may be flat plates or other shapes. Moreover, while the bottom transducer assembly 20300 is illustrated as utilizing a single transducer 20305, a plurality of transducers can be used if desired to create the acoustic energy. Preferably, the transducer 20305 is adapted to generate megasonic energy.

The transmitter 20302 is connected to the housing 20304 so as to form a substantially enclosed space 20310 in which the transducer 20305 is located. Any suitable means can be used to connect the housing 20304 to the transmitter 20302, including adhesion, heat welding, fasteners or a tight-fit assembly. A plurality of openings 20311 are provided in the bottom portion of the housing 20304. The openings 20311 are provided to allow a gas to be introduced into and/or out of the space 20310 so that the transducer 20305 can be cooled and/or purged. The openings 20311 are operably connected to the gas source 2020 as described in FIG. 15. The housing 20304 also comprises an opening 20312 for allowing the electrical connections (i.e., wires) that are necessary to power the transducer 20305 to pass into the space 20310. This opening 20312 can also be used to allow the gas to escape the space 20310. The housing 20304 can take on a wide variety of shapes and structures and is not limiting of the present invention. In some embodiments, the housing may be merely a plate or other simple structure.

In order to further protect the wafer 2050 from possible contamination, once the transmitter 20302 is connected to the housing 20304, the combined assembly may be fully encapsulated with an inert non-contaminating plastic, such as TEFLON® or the like. This also serves to protect the transmitter 20302 from chemical attack. When the transmitter 20302 is so encapsulated and/or coated, the encapsulation and/or coating is considered part of the transmitter 20302.

Figure 18:
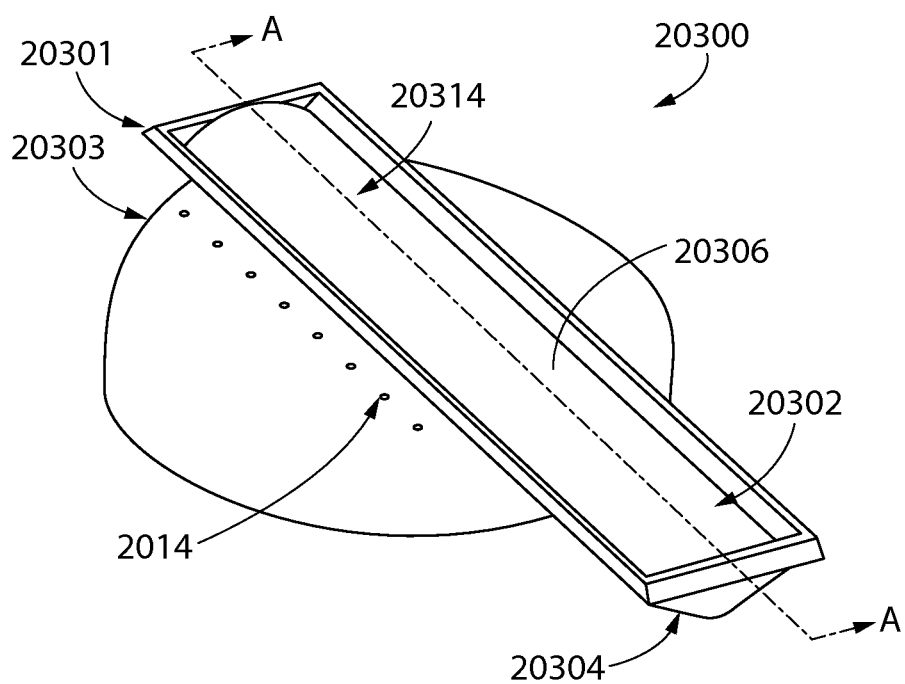
FIG. 18 is a transducer assembly according to one embodiment of the present invention that is utilized in the acoustic energy cleaning system of FIG. 16 as the bottom-side transducer assembly.
Figure 19:
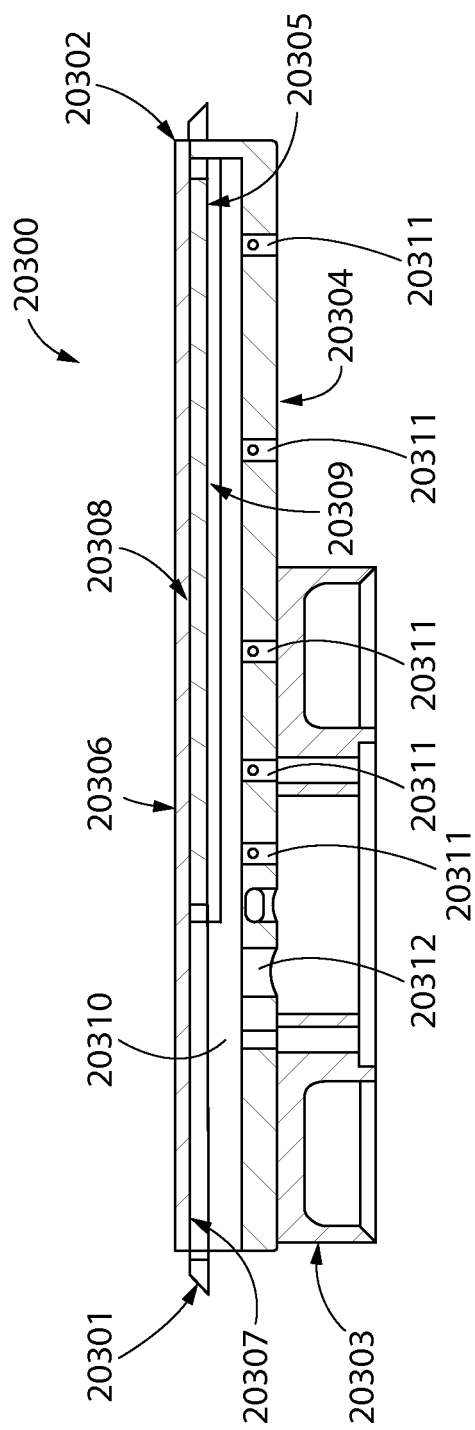
FIG. 19 is a cross-sectional view of the transducer assembly of FIG. 18 along cross-section cut A-A of FIG. 18.
Figure 20:
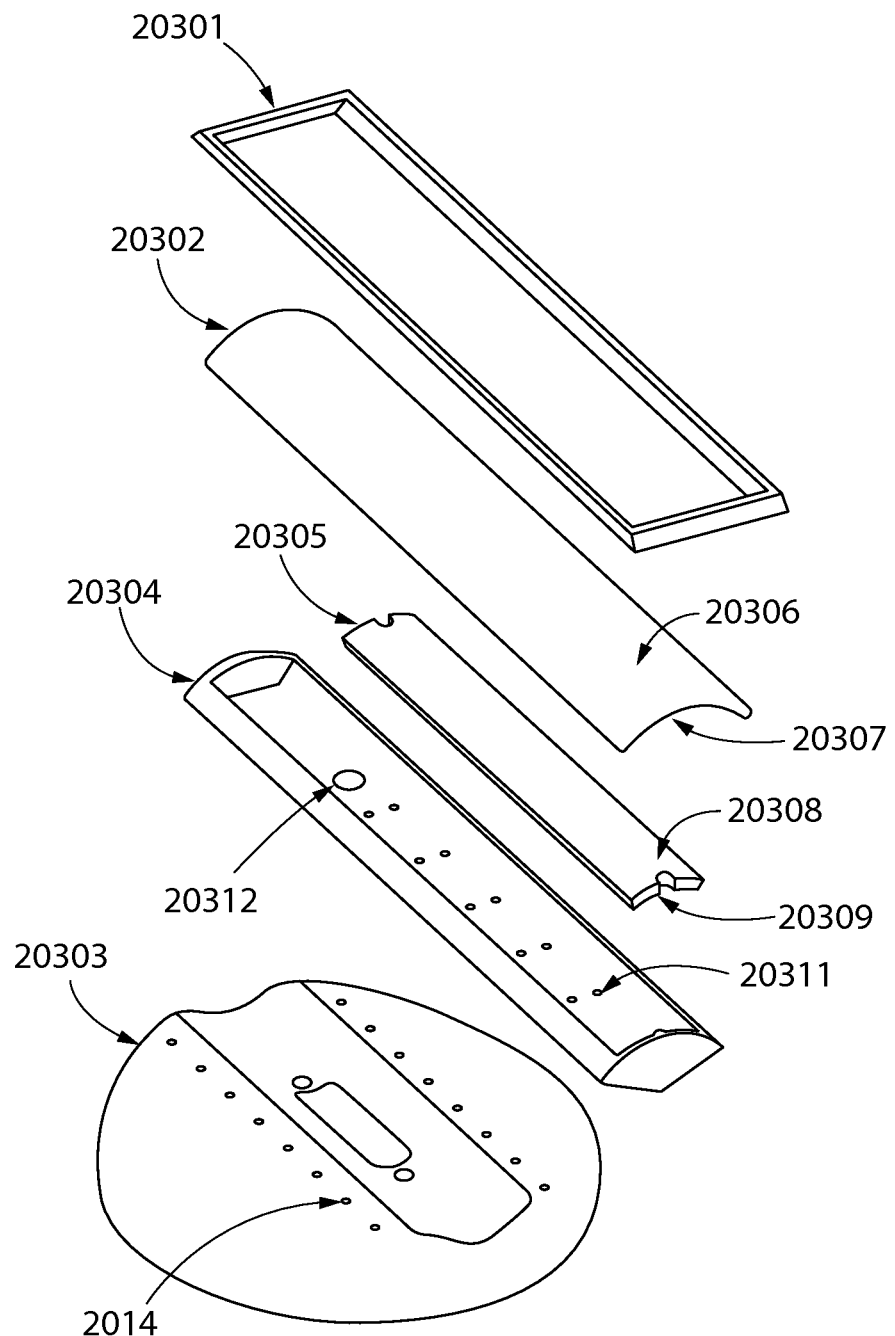
FIG. 20 is an exploded view of the transducer assembly of FIG. 18.
Figure 21:
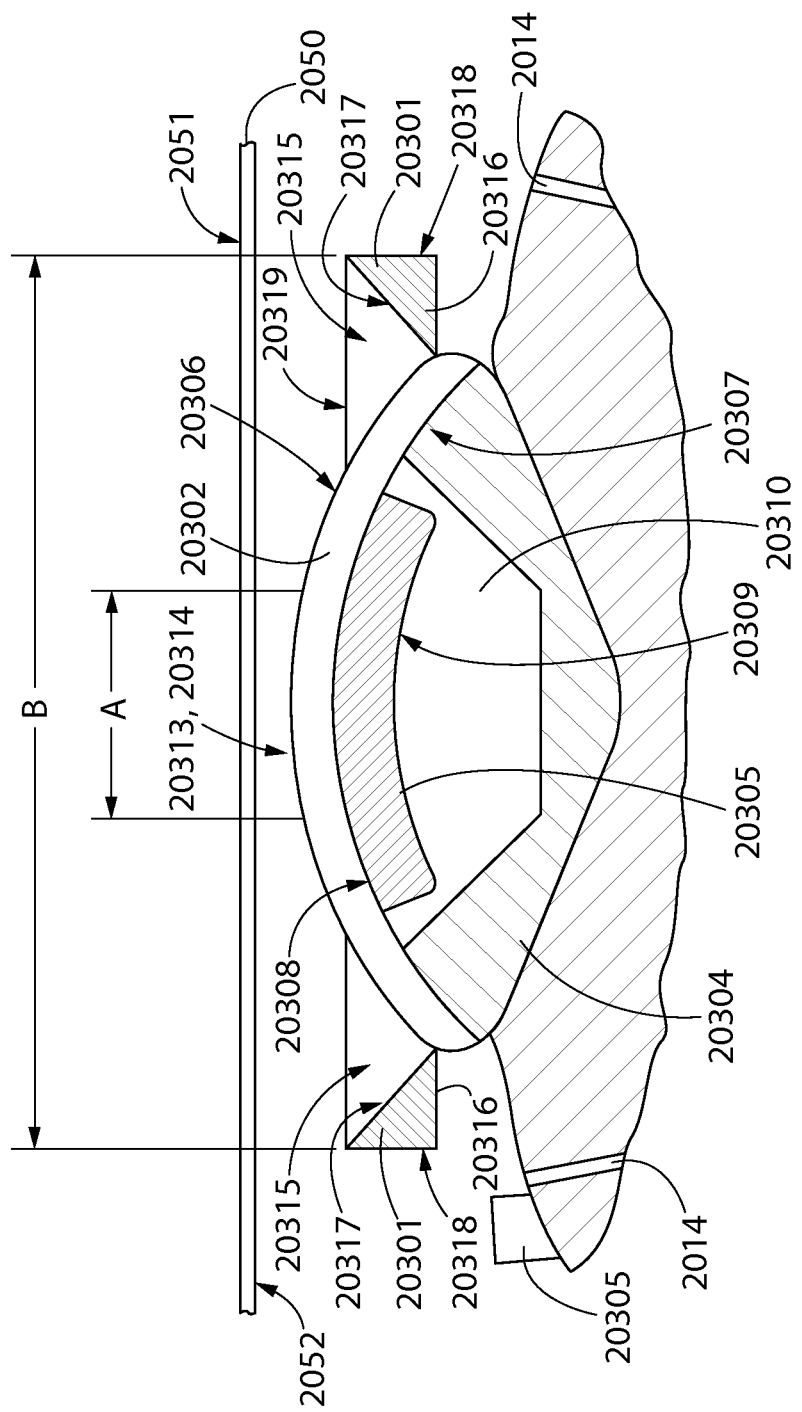
FIG. 21 is a schematic of the transducer assembly of FIG. 18 positioned adjacent a bottom surface of a semiconductor wafer according to an embodiment of the present invention wherein the transducer assembly of FIG. 18 is shown in cross-section.

Referring exclusively to FIGS. 18 and 21, the bottom transmitter assembly 20300 further comprises a dam 20301 that surrounds the periphery/perimeter of the transmitter 20302. The dam 20301 forms an upwardly protruding ridge 20316 having an angled inner surface 20317, an outer surface 20318 and a top edge 20319. The dam 20301 forms a liquid retaining channel 20315 on both sides of the transmitter 20302. More specifically, the inner surface 20317 of the ridge 20316 forms a channel/groove with the transmitter 20302. Of course, in some embodiments, the dam 20301 could be used to form the channel 20315 in other ways and/or through cooperation with other structures.

The dam 20301 is a rectangular frame-like structure but can take on other shapes. The dam 20301 also does not have to surround the entire periphery of the transmitter 20302 but can surround only a small portion if desired. The dam 20301 can be constructed of HDPE, PVDF, NPP or any other material. Preferably, the material chosen is chemically resistant and mechanically stable.

The dam 20301 is implemented into the bottom transducer assembly 20300 to increase the size of the meniscus that couples the transmitter 20302 to the bottom surface 2052 of the wafer 2050. This facilitates an increased amount of acoustic energy being transmitted to the wafer 2050 for improved cleaning. As illustrated in FIG. 21, without the dam 20301, the meniscus couples only area A of the transmitter 20302 to the wafer 2050. However, with the dam 20301, the meniscus coupling area is increased to area B.

Referring now to FIGS. 22-26, the possibilities for the relative arrangement of the bottom transducer assembly 20300 and the top transducer assembly 20200 with respect to one another in the cleaning system 201000 will be discussed.

Figure 22:
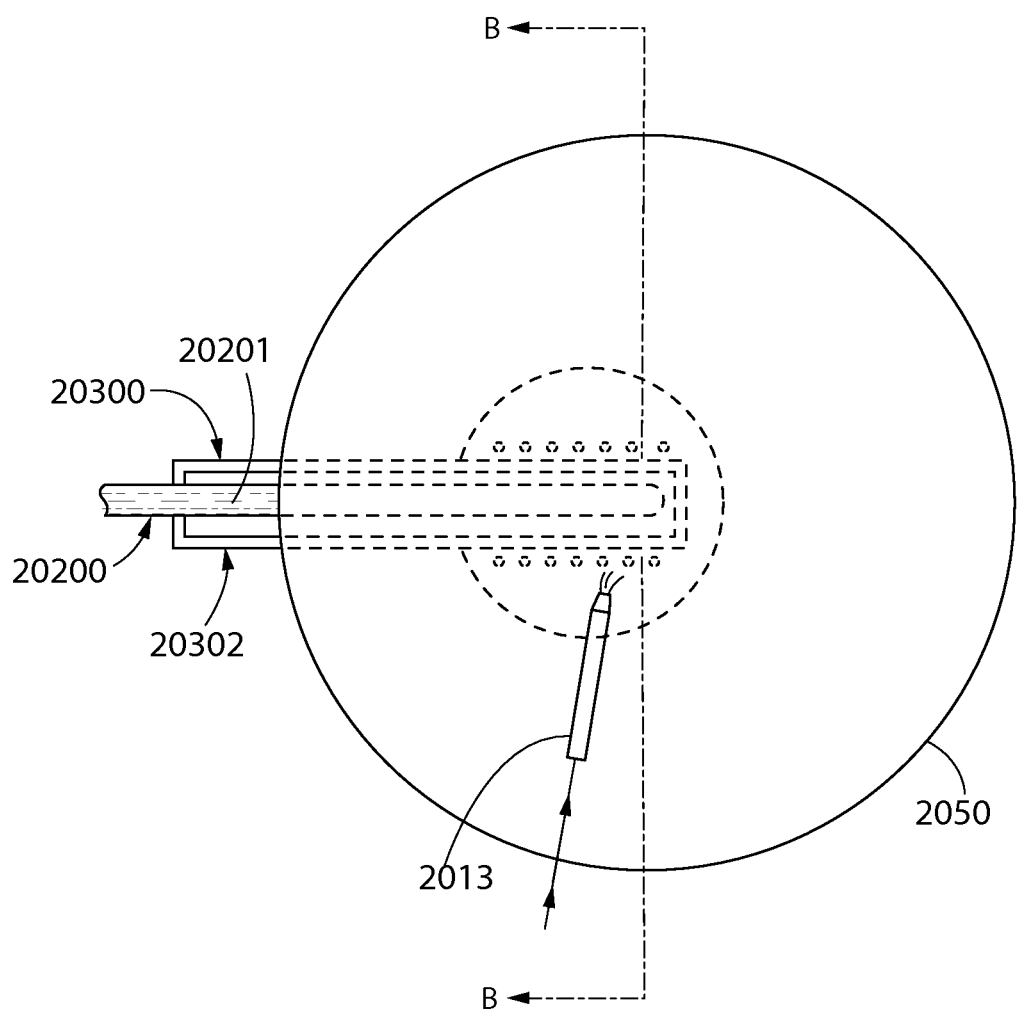
FIG. 22 is a schematic representation of one arrangement of the topside transducer assembly relative to the bottom-side transducer assembly for the acoustic energy cleaning system of FIG. 16.
Figure 23:
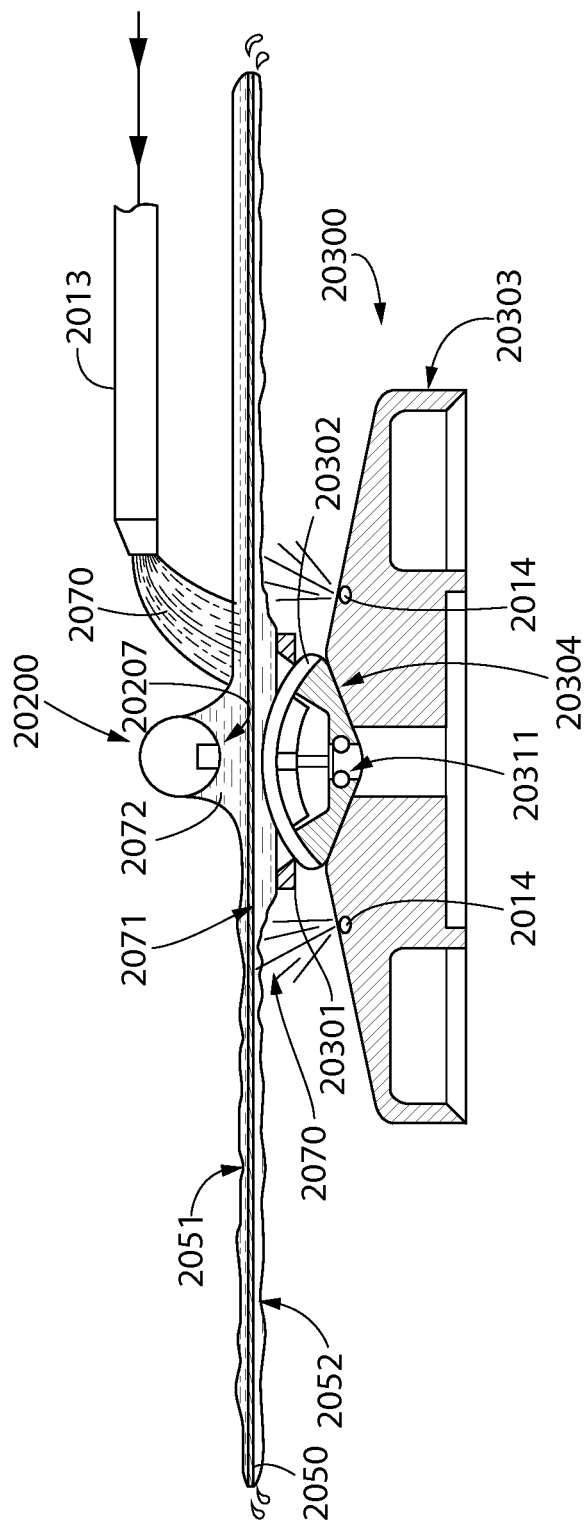
FIG. 23 is a cross-sectional view of the schematic representation of the transducer assembly arrangement of FIG. 22 along the cross-section cut B-B of FIG. 8.

Referring first to FIGS. 22 and 23, an arrangement is illustrated wherein the transmitter 20201 of the top transducer assembly 20200 is aligned with and opposes the transmitter 20302 of the bottom transducer assembly 20300. A wafer 2050 is illustrated as being in between the assemblies 20200, 20300. As liquid 2070 is applied to the top surface 2051 of the wafer 2050, a meniscus of liquid 2072 is formed between a bottom portion 20207 of the transmitter 20201 of the top transducer assembly 20200 and the top surface 2051 of the wafer 2050. Similarly, as liquid 2070 is applied to the bottom surface 2052 of the wafer 2050, a meniscus of liquid 2071 is formed between the transmitter 20302 of the bottom transducer assembly 20300 and the bottom surface 2052 of the wafer 2050. As can be seen, the coupled portions of the top transmitter 20201 and the bottom transmitter 20302 oppose one another in an aligned manner. As a result, it is possible that the acoustic energy is generated by the top and bottom transducer assemblies 20200, 20300 and transmitted to the wafer via the meniscuses 2071, 2072 can interfere with and/or cancel one another out.

Thus, it may be desirable, in certain instances, to operate the top and bottom transducer assemblies 20200, 20300 in an alternating and/or consecutive manner during a wafer cleaning cycle. In other embodiments, one may want to activate the operate the top and bottom transducer assemblies 20200, 20300 concurrently if interference is not an issue.

Figure 24:
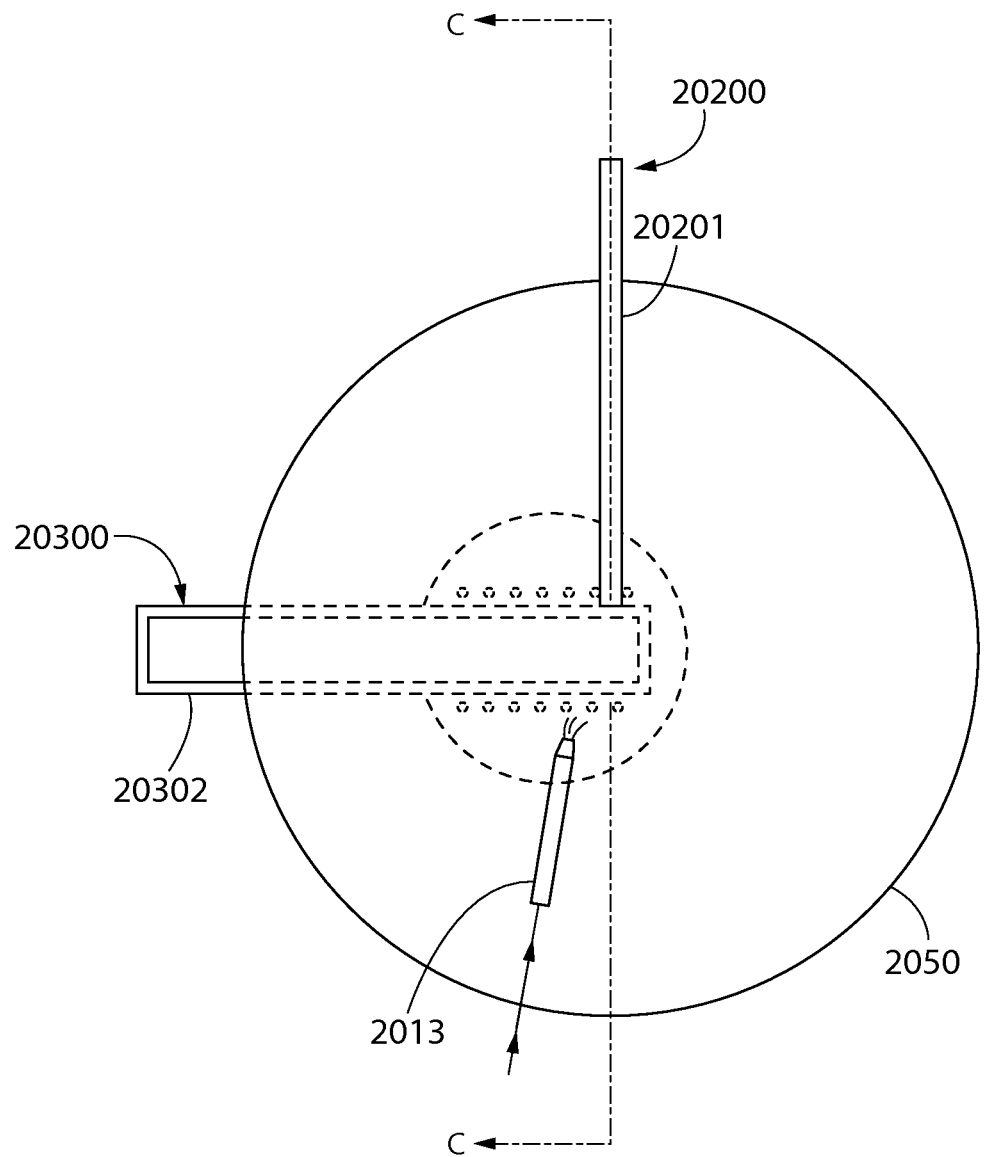
FIG. 24 is a schematic representation of an alternative arrangement of the topside transducer assembly relative to the bottom-side transducer assembly for the acoustic energy cleaning system of FIG. 16.
Figure 25:
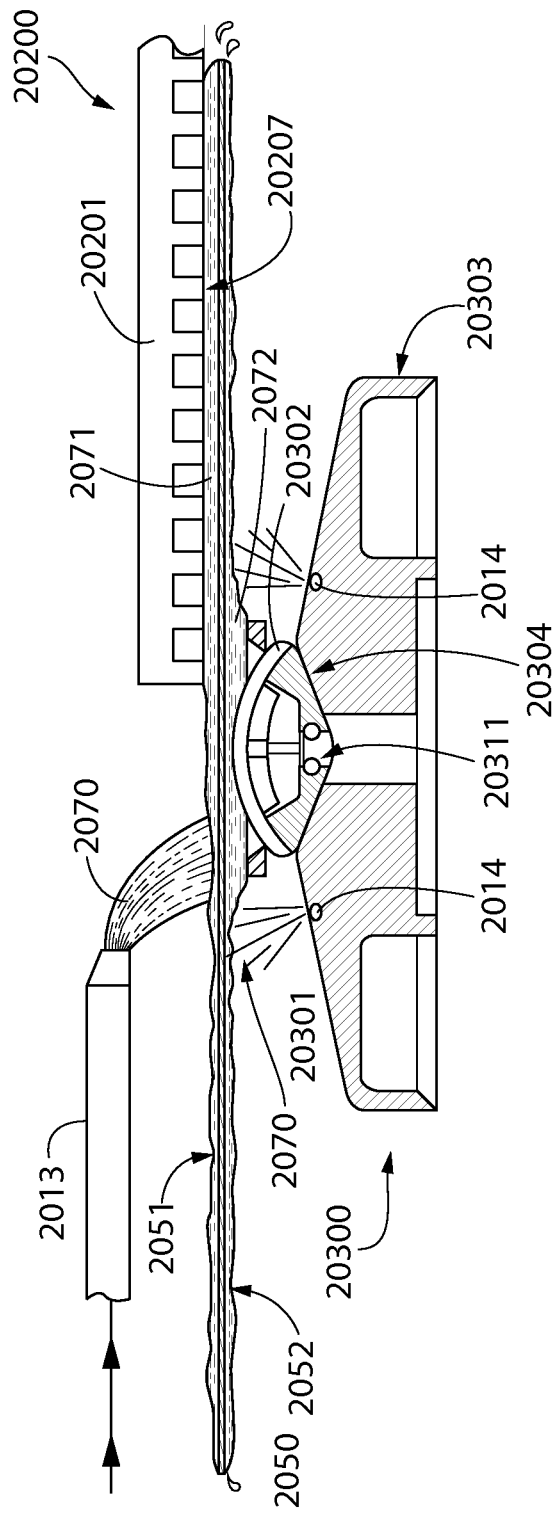
FIG. 25 is a cross-sectional view of the schematic representation of the alternative transducer assembly arrangement of FIG. 24 along the cross-section cut C-C of FIG. 8.

Referring now to FIGS. 24 and 25 concurrently, an alternative relative arrangement of the bottom transducer assembly 20300 and the top transducer assembly 20200 with respect to one another in the cleaning system 201000 is illustrated. In this embodiment, the transmitters 20201, 20302 of the top and bottom transducer assemblies 20200, 20300 are not aligned and do not oppose one another. Thus, interference should not be a problem during simultaneous generation and transmission of acoustic energy to the wafer. While the horizontal angle of separation between the top and bottom transmitters 20201, 20302 is 90 degrees in the illustration, any other angle can be used, including without limitation 180 degrees, 45 degrees, etc.

It was discovered during the creation of the above described system that improved cleaning results were achieved by just having the bottom transducer assembly 20300 present in the cleaning system 201000 and arranged as shown in FIG. 22, even when not activated (i.e., passive). It was discovered that the transmitter 20302 of the bottom transducer assembly 20300 was reflecting at least a fraction of the acoustic energy that was generated by the top transducer assembly 20200 back toward the bottom surface 2051 of the wafer 2050. Therefore, in another aspect, the invention is a novel system that utilizes a passive reflective member coupled to the opposite surface of the water than the active transducer assembly.

Figure 26:
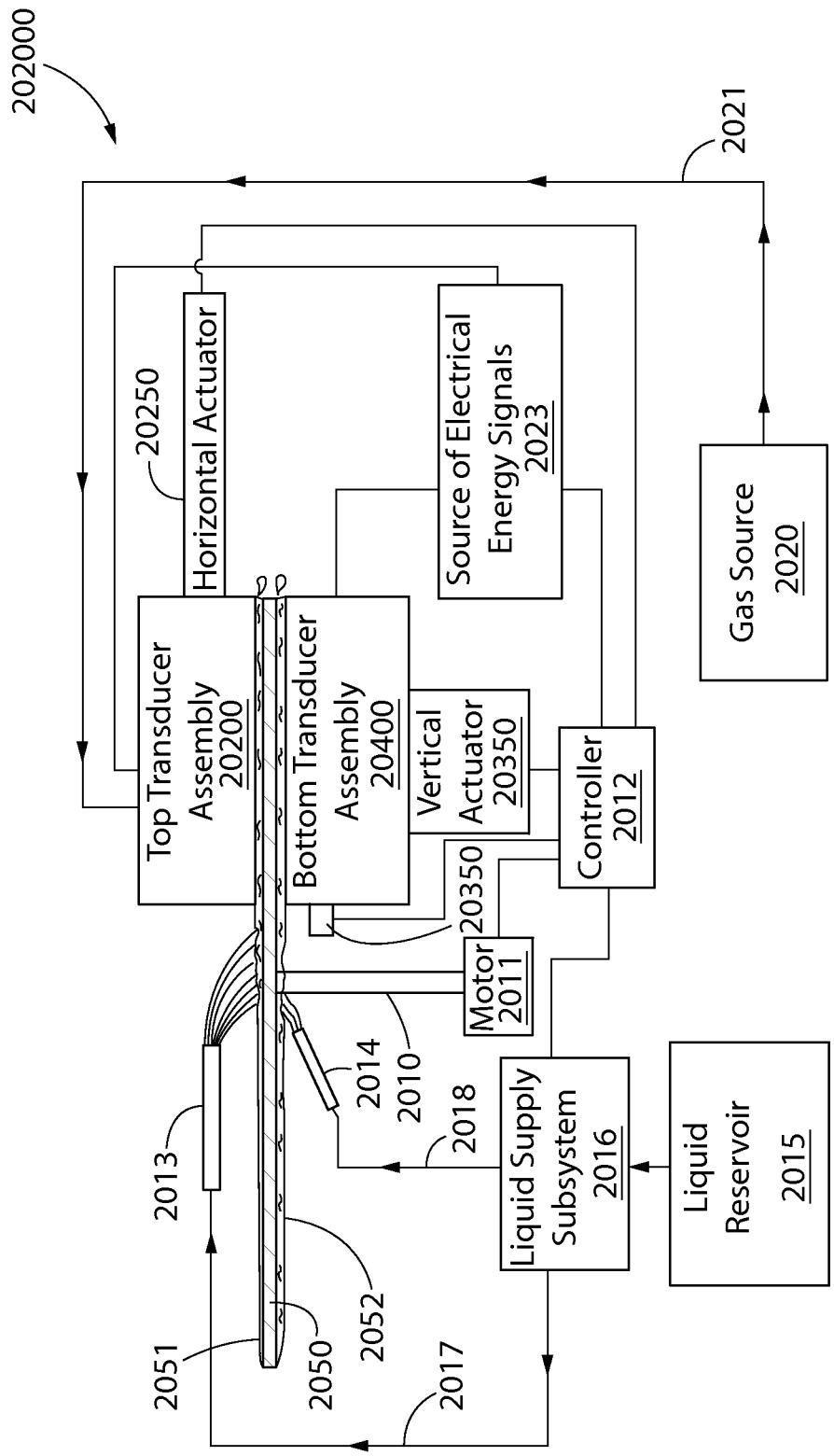
FIG. 26 is schematic of an acoustic energy cleaning system utilizing a reflective member according to one embodiment of the present invention.

Referring now to FIG. 26, a cleaning system 202000 that utilizes a passive backside reflective member 20400 is schematically illustrated. The cleaning system 202000 is identical to that of cleaning system 201000 except that the bottom transducer assembly is replaced by a reflective member 20400. In fact, in some embodiments, the reflective member 20400 could be a transducer assembly, such as the one described above, that is not activated. However, the reflective member 20400 is not so limited and can take on a much broader variety of structures. Thus, a detailed explanation of the cleaning system 202000 will be omitted with the understanding that the description of cleaning system 201000 above will suffice for like parts. Like numbers are used to reference like parts.

The reflective member 20400 could be a mere plate or other structure. Preferably, the reflective member 20400 is made of a material that has an acoustical impedance value (Za) that is much greater than that of water. In one embodiment, it is preferred that the acoustical impedance value be at least greater than 5.0 Mrayl, such as quartz. It may also be preferred that the reflective member 20400 be spaced from the surface of the wafer 2050 to which it is fluidly coupled by a distance that is a one-fourth interval of the wavelength of the acoustic energy being generated by the top transducer assembly 20200. In some alternative embodiments the reflective member 20400 may be used to absorb the acoustical energy instead of reflecting it.

The reflective member 20400 may be made of a variety of materials the selection of which is dependent upon whether or not it is intended to be used as a reflector or an absorber of the acoustical energy. In the embodiment shown in FIGS. 26 and 27 the reflective member 20400 is designed to reflect acoustical energy. The reflective member 20400 may be made of materials such as quartz, sapphire, silicone carbine, or boron nitride. Should acoustical energy wish to be absorbed the member 20400 can be constructed out of PolyVinylidine DiFluoride (PVDF) or polytetrafluoroethylene (PTFE) (Also commonly sold under the trade name TEFLON®). The materials chosen are based upon their respective acoustical impedance (Za). Table 1 (below) provides a list of materials and the Zas associated with them.

TABLE 1

| Material | Za |
|---|---|
| Alumina | 40.6 |
| Aluminum rolled | 17.33 |
| ARALDITE ® 502/956 20 phe | 3.52 |
| ARALDITE ®502/956 50 phe | 4.14 |
| ARALDITE ®502/956 90 phe | 12.81 |
| Beryllium | 24.10 |
| Bismuth | 21.5 |
| Brass 70 cu 30 Zn | 40.6 |
| Brick | 7.4 |
| Cadmium | 24 |
| Carbon vitreous, sigradur K | 7.38 |
| Concrete | 8.0 |
| Copper rolled | 44.6 |
| Duraluminum 17S | 17.63 |
| EPOTEK ® 301 | 2.85 |
| Fused silica | 12.55 |
| Germanium | 29.6 |
| Glass pyrex | 13.1 |
| Glass quartz | 12.1 |
| Glass silica | 13 |
| Glucose | 5.0 |
| Gold | 63.8 |
| Granite | 26.8 |
| Indium | 18.7 |
| Iron | 46.4 |
| Iron cast | 33.2 |
| Lead | 24.6 |
| Lithium | 33.0 |
| Magnesium | 10.0 |
| Marble | 10.5 |
| Molybdenum | 63.1 |
| Nickel | 49.5 |
| Paraffin | 1.76 |
| Polyester casting resin | 2.86 |
| Porcelain | 13.5 |
| PVDF | 4.2 |
| Quartz x cut | 15.3 |
| Rubidium | 1.93 |
| Salt crystalline x direction | 10.37 |
| Sapphire, aluminum oxide | 44.3 |
| SCOTCH ® tape 2.5 mils thick | 2.08 |
| Silicon very anisotropic approx | 19.7 |
| Silicon carbide | 91.8 |
| Silicon nitride | 36 |
| Silver | 38.0 |
| Steel mild | 46.0 |
| Steel stainless | 45.7 |
| STYCAST ® | 2.64 |
| Tantalum | 54.8 |
| TEFLON ® | 2.97 |
| Tin | 24.2 |
| Titanium | 27.3 |

TABLE 1-continued

| Material | Za |
|---|---|
| Tracon | 4.82 |
| Tungsten | 101.0 |
| Uranium | 63.0 |
| Vanadium | 36.2 |
| Wood cork | 0.12 |
| Wood pine | 1.57 |
| Zinc | 29.6 |
| Zinc oxide | 36.4 |
| Zirconium | 30.1 |

The acoustical impedance Za of a material is defined as the product of the density of that material times the velocity of sound in that material. The units for Za are Mrayl or (kg/m²s× $10^6$). Acoustical energy transmission is affected by the differences in the Za of the materials through which the acoustical energy must pass. More specifically, large differences in the Za between adjacent materials through which the acoustical energy must pass results in increased impedance of the acoustical energy.

Due to the acoustical impedance values of the various surfaces of the reflective member 20400, the acoustical energy is effectively transmitted back towards the wafer 2050. This effectively cleans the bottom surface 2052 without having to provide additional transducers. As discussed above, the reflective member 20400 is made of a material with a Za that is greater than the fluid through which the acoustical energy is transmitted. Preferably the Za should be greater than 5 Mrayl, and more preferably greater than 15 Mrayl, such as quartz. The reflective member 20400 may be hollow in order to create an additional transitional space that causes the acoustical energy to be reflected again as it passes through the reflective member 20400. During the cleaning process there may be continuous reflection between the wafer 2050 and the reflective member 20400 and it may continue until the acoustical energy diminishes in the system.

Figure 27:
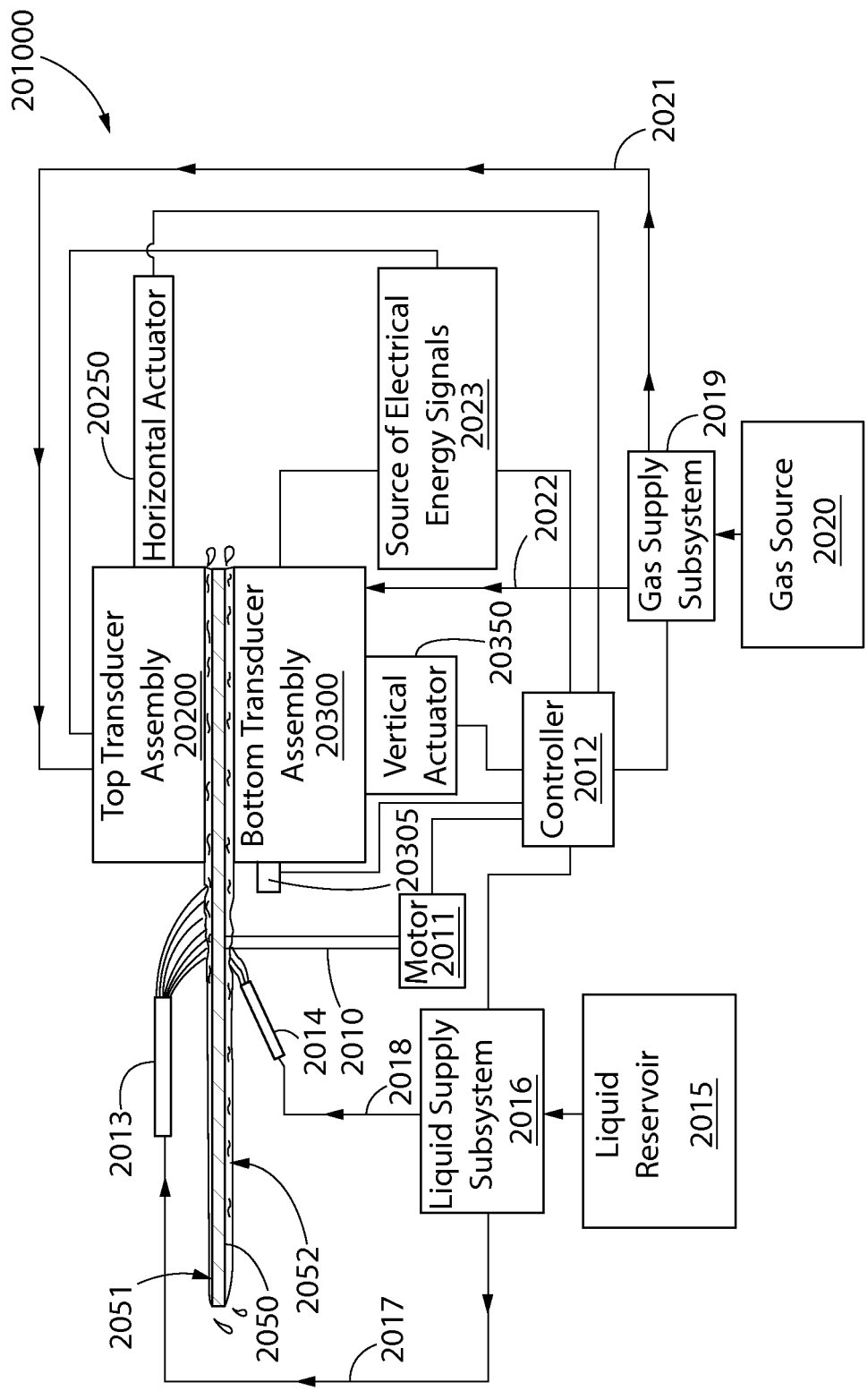
FIG. 27 is schematic of an acoustic energy cleaning system utilizing a reflective member according to an alternative embodiment of the present invention.

FIG. 27 shows an alternative embodiment of the passive cleaning system 202000 wherein the reflective member 20400 is positioned adjacent the top surface 2051 of the wafer 2050 rather than the bottom surface 2052. A bottom transducer assembly 20300 is used instead of a top transducer assembly 20200. This embodiment operates in much the same fashion as the embodiment shown in FIG. 26 except with the reflective member 20400 and the transducer assembly 20300 being reversed.

Figure 28:
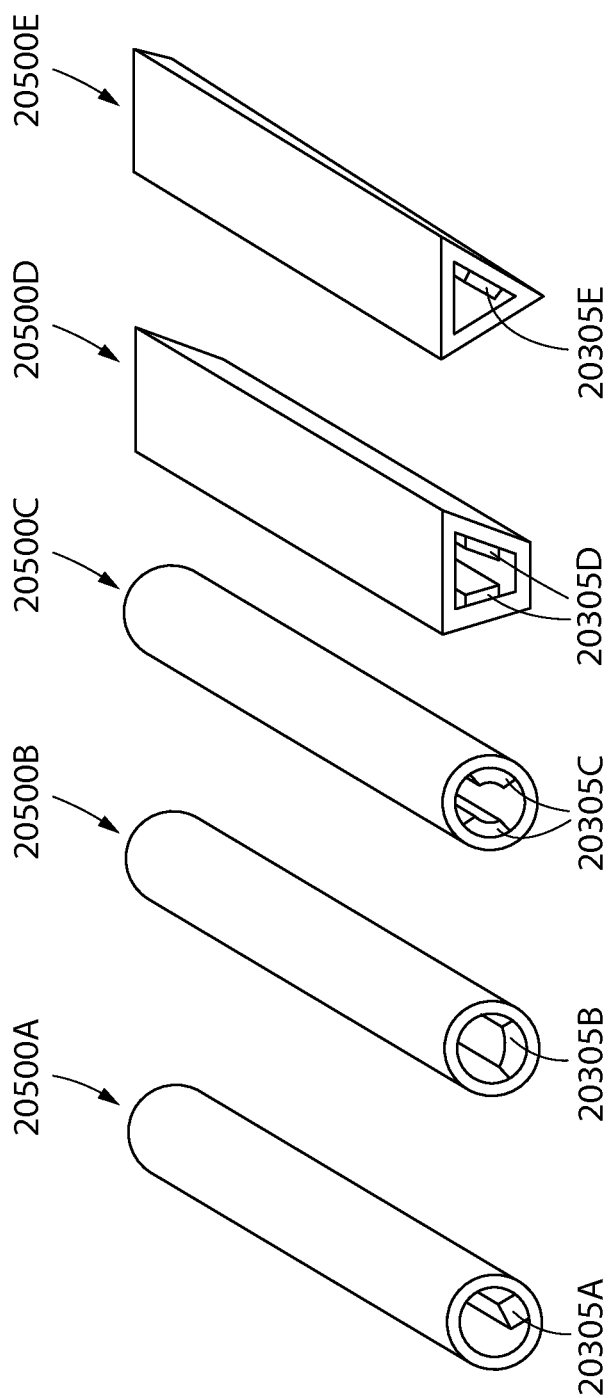
FIG. 28 shows five alternative embodiments of a transducer assembly that can also act as a reflective member for use in the acoustic energy cleaning system of FIG. 26.

Referring now to FIG. 28, it has been discovered that it may be preferable to utilize hollow tubular structures as the reflective member 20400. Examples of hollow tubular members 20500A-E are exemplified. The hollow tubular member 20500A-E can be fitted with transducers 20305A-E if desired. The tubular member can be made of quartz, plastic, metals, or other materials. These tubular members 20500A-E will have different effects on the transmission of the acoustical energy. The tubular members 20500A-E modifiers may be cylindrically shaped, triangular shaped, and trapezoidal shaped. It should be understood that other shapes may be used and are not limited to those shown, the selection of the shape may vary depending upon the desired results.

The rounded or angled tubular members 20500A-E also may be used to direct the reflected acoustical energy at lower angles than that which it is at when it is directed at the wafer 2050. Typically these angles are less than 40°. By reflecting the acoustical energy at a shallow angle, a majority of the acoustical energy will be focused on the bottom surface 2052 of the wafer 2050 from the top transducer assembly 20200.

It has also been discovered that the placement of the reflective member 20400 from the wafer 2050 also plays a role in effectively removing particles. The distance, or gaps, between the reflective member 20400, the transducer assembly 20200 or 20300 and the wafer 2050 is determined so as to accommodate the frequency of the wavelength. The equation for the wavelength is:

$$\lambda = \frac{V\omega}{f} \quad (1)$$

where $\lambda$=wavelength of an acoustical wave, $v_w$ is the speed of propagation of the wave, and f=frequency of the wave in 1/s=Hz. Odd ¼ wavelength (e.g. ¼, ¾, 1¼) gaps tend to act as matching layers that permit energy to pass into the next media, and even ¼ wavelengths (e.g. 0.5, 1.0, 1.5, 2.0) gaps between the wafer 2050 and the reflective member 20400 tend to enhance the reflective property at the media interface. For example, in FIG. 26, the gap between the top transducer assembly 20200 and the wafer 2050 may be set for 1 and ¼ wavelengths in order to enhance the transmission of the acoustical energy through the cleaning liquid and the wafer 2050. On the opposite side, the gap between the reflective member 20400 and the wafer 2050 may be set at 1.0 wavelength (i.e. even) in order to enhance the reflection property so as to keep the transmission of acoustical energy directed towards the bottom surface 2052 of the wafer 2050. In the example provided, when using water and a frequency of 835 kHz, the 1 and ¼ wavelength, the gap between the transducer assembly 20200 and the wafer 2050 is approximately 0.087". The gap between the reflective member 20400 and the wafer 2050, the 1.0 wavelength, is approximately 0.070".

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

The invention claimed is:

1. An apparatus for processing articles with acoustic energy comprising:
    a support for supporting an article to be processed;
    a conduit for applying a fluid to a surface of the article; and
    a transducer assembly comprising:
        a transmitting structure having a concave inner surface and a convex outer surface;
        a first acoustic transducer having a convex bottom surface bonded to the concave inner surface of the transmitting structure, wherein the first acoustic transducer is configured to create a first acoustically active area on the convex outer surface of the transmitting structure when the first acoustic transducer is energized; and
        a second acoustic transducer having a convex bottom surface bonded to the concave inner surface of the transmitting structure, wherein the second acoustic transducer is configured to create a second acoustically active area on the convex outer surface of the transmitting structure when the second acoustic transducer is energized, wherein:
            the second acoustic transducer is spaced from the first acoustic transducer so that an acoustically inactive area exists on the convex outer surface between the first and second acoustically active areas when the first and second acoustic transducers are energized, the transducer assembly is positioned adjacent to and opposing the surface of the article so that when the fluid is applied to the surface of the article by the conduit, the convex outer surface of the transmitting structure is fluidly coupled to the surface of the article, and the transducer assembly is oriented so that the acoustically inactive area of the convex outer surface faces the surface of the article and is closer to the surface of the article than the first and second acoustically active areas of the transmitting structure.

2. The apparatus of claim 1 wherein the first and second acoustic transducers are spaced from one another by at least 45 degrees of the concave inner surface.

3. The apparatus of claim 1 wherein the support is a rotatable support.

4. The apparatus of claim 1 wherein the transducer assembly is oriented so that acoustic waves generated by the first and second acoustic transducers are propagated at the surface of the article at a non-normal angle that results in reflected acoustic waves traveling away from the transducer assembly.

5. The apparatus of claim 1 wherein each of the first and second acoustic transducers are formed by a composite assembly comprising a plurality of pillars constructed of a piezoelectric material, the pillars arranged in a spaced-apart manner so that spaces exist between adjacent pillars; the pillars having a width and a height extending between a top surface and a bottom surface, wherein the height of the pillars is greater than the width of the pillars; and the spaces filled with a resilient material so as to form the composite assembly.

6. The apparatus of claim 1 wherein:

the transducer assembly comprises a first transducer assembly and a second transducer assembly;

the conduit is configured to apply a first liquid to a top surface of the article and a second liquid to a bottom surface of the article;

a portion of the first transducer assembly is in contact with the first liquid; and a portion of the second transducer assembly is in contact with the second liquid.

* * * * *